United States Patent [19]
Hopewell et al.

[11] Patent Number: 5,124,927
[45] Date of Patent: Jun. 23, 1992

[54] LATENT-IMAGE CONTROL OF LITHOGRAPHY TOOLS

[75] Inventors: William D. Hopewell, Ridgefield, Conn.; Robert R. Jackson, Millbrook, N.Y.; Jerry C. Shaw, Ridgefield, Conn.; Theodore G. Van Kessel, Millbrook, N.Y.

[73] Assignee: International Business Machines Corp., Armonk, N.Y.

[21] Appl. No.: 488,342

[22] Filed: Mar. 2, 1990

[51] Int. Cl.⁵ .............................................. G06F 15/46
[52] U.S. Cl. ................................ 364/468; 250/491.1; 356/394; 356/401; 364/491; 364/559
[58] Field of Search .......... 364/468, 474.02, 488–491, 364/559; 250/491.1, 397, 398; 356/372, 394, 389, 397, 400, 401, 349, 359; 430/394, 326, 311, 30, 935; 378/34, 35; 355/43, 53

[56] References Cited

U.S. PATENT DOCUMENTS

| | | | |
|---|---|---|---|
| 4,559,603 | 12/1985 | Yoshikawa | 364/491 |
| 4,640,619 | 2/1987 | Edmark, III | 356/372 |
| 4,701,859 | 10/1987 | Matsuyama et al. | 364/490 |
| 4,707,610 | 11/1987 | Linow et al. | 250/560 |
| 4,727,381 | 2/1988 | Bille et al. | 346/108 |
| 4,741,622 | 5/1988 | Suwa et al. | 356/401 |
| 4,748,335 | 5/1988 | Lindow et al. | 250/571 |
| 4,758,094 | 7/1988 | Wihl et al. | 356/394 |
| 4,766,311 | 8/1988 | Seiler et al. | 250/252.1 |
| 4,788,117 | 11/1988 | Cuthbert et al. | 430/30 |
| 4,794,426 | 12/1988 | Nishi | 355/43 |
| 4,814,829 | 3/1989 | Kosugi et al. | 355/43 |
| 4,834,540 | 5/1989 | Totsuka et al. | 356/401 |
| 4,984,890 | 1/1991 | Tojo et al. | 356/401 X |
| 5,048,967 | 9/1991 | Suzuki et al. | 356/400 X |

FOREIGN PATENT DOCUMENTS

| | | |
|---|---|---|
| 0167410 | 1/1986 | European Pat. Off. |
| 0168643 | 1/1986 | Fed. Rep. of Germany |
| 2181539 | 4/1987 | Fed. Rep. of Germany |

OTHER PUBLICATIONS

M. J. Fairlie et al., "Surface roughness evaluation by image analysis in Nomarski DIC microscopy", SPIE vol. 749 Meteorology, Figure and Finish (1987) pp. 105–112.

Jay M. Eastman, "A New Optical Surface Microprofiling Instrument", 1983, pp. 56–64.

(List continued on next page.)

Primary Examiner—Joseph Ruggiero
Attorney, Agent, or Firm—Perman & Green

[57] ABSTRACT

Measurement apparatus and procedure for use with lithographic equipment is provided for the construction of electronic and other devices wherein a photoresist is deposited as a layer upon a substrate. A Nomarski differential interference contrast microscope in conjunction with a scanned image detector is employed to examine verification marks produced by projection of an overlay, such as the mask or reticle, upon the photoresist layer. The projection results in a production of verification marks in the form of a latent image which, while invisible with conventional viewing means, can be viewed by phase-contrast imaging employing differential phase shift. Various characteristics of the resultant image are employed to align secondary verification marks with primary verification marks previously provided on the substrate, and to allow for a checking of line width, dosage, focusing, temperature control, and global alignment. Observation of the photoresist is accomplished with radiation at lower frequency than the exposure radiation, the latter being significantly absorbed, by the photoresist, the photoresist being transparent to the observation radiation to permit reflection from top and bottom surfaces of the photoresist.

8 Claims, 14 Drawing Sheets

OTHER PUBLICATIONS

M. J. Penberth et al., "Performance Modelling of Pattern Recognition Techniques For Calibration and Registration mark Detection"; Date unknown.

David S. Perloff, "A Foru-Point Electrical Measurement Technique for Characterizing Mask Superposition Errors on Semiconductor Wafers", IEEE Journal of Solid State Circuits, Aug. 1978, pp. 436-444.

Chappelow et al., "Multipoint Alignment: Methods For Providing Improved Overlay Yield", IBM Technical Disclosure Bulletin, vol. 26, No. 11, Apr. 1984, pp. 5896-5897.

K. W. Edmark et al., "Stepper Overlay Calibration Using Alignment To a Latent Image", Mar. 1985.

Smart Set Operation Manual of GCA Corporation, printed Dec. 4, 1986.

"Overlay Characterization Technique For Exposing Integrated Circuit Wafers", IBM Technical Disclosure Bulletin, vol. 28, No. 10, Mar. 1986, p. 4302.

European Search Report, GB-A-218539, Apr. 23, 1987.

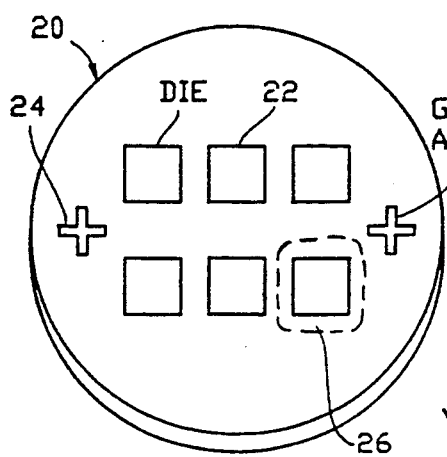
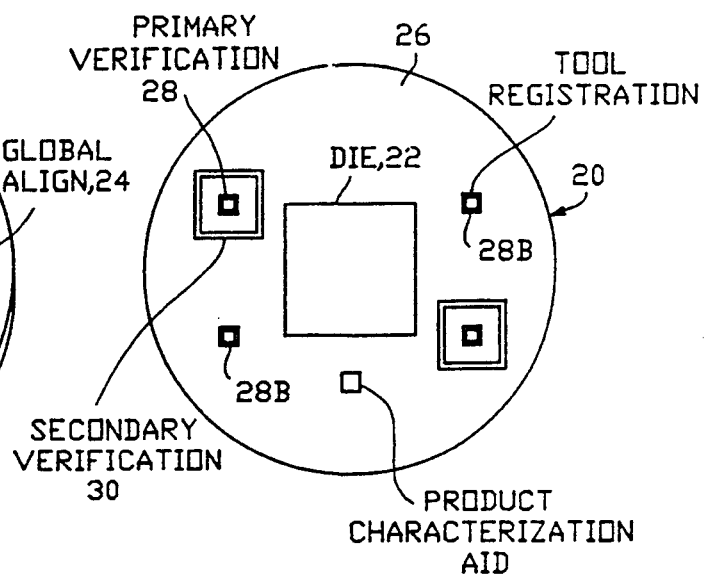
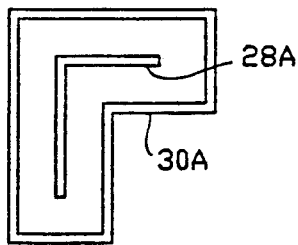
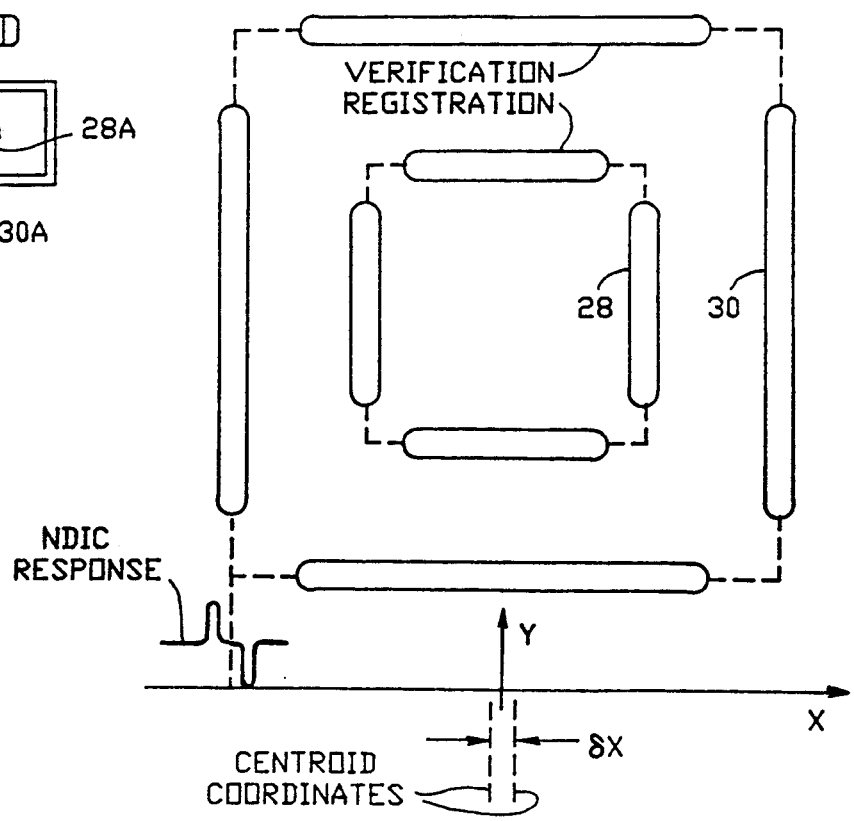

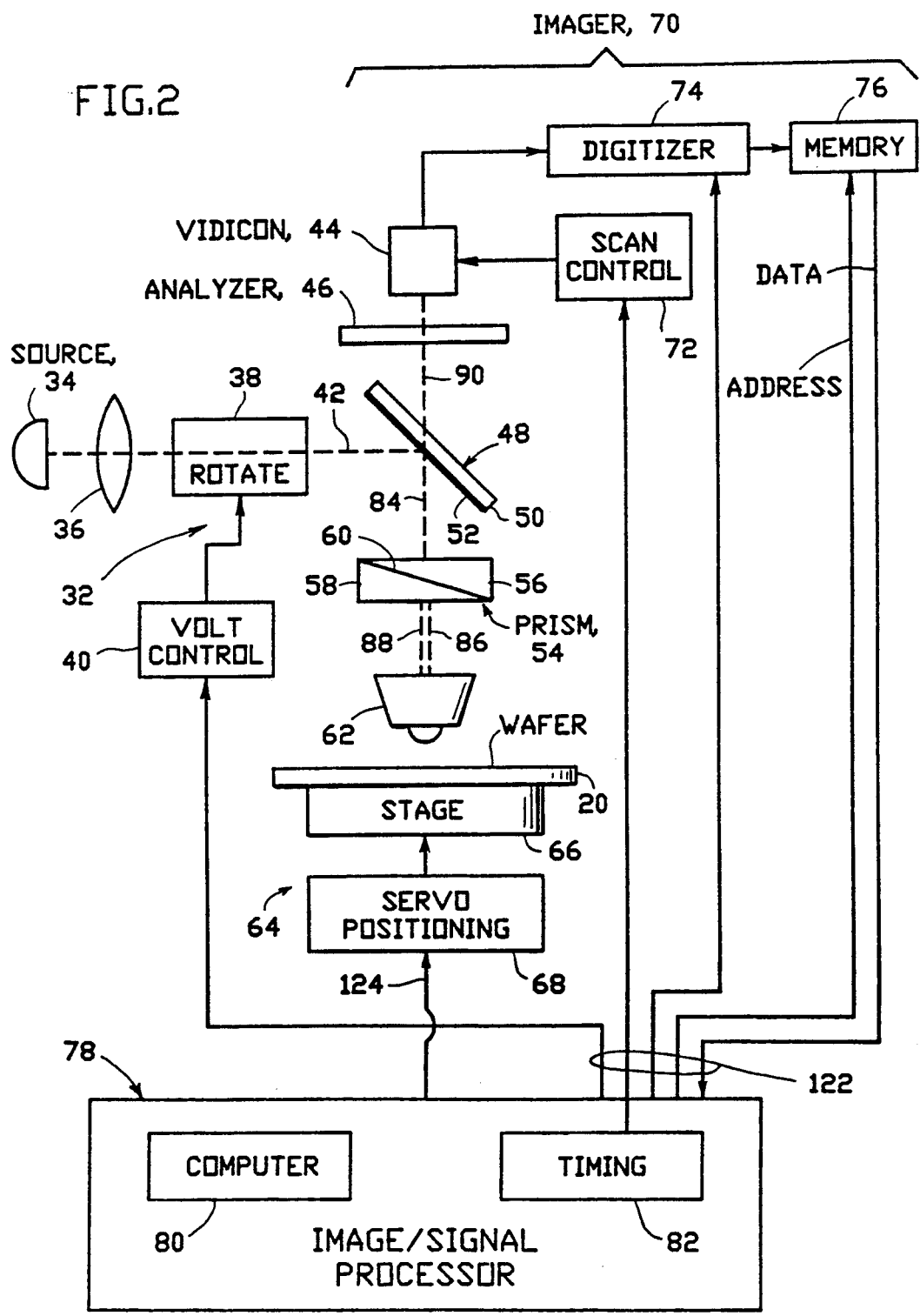

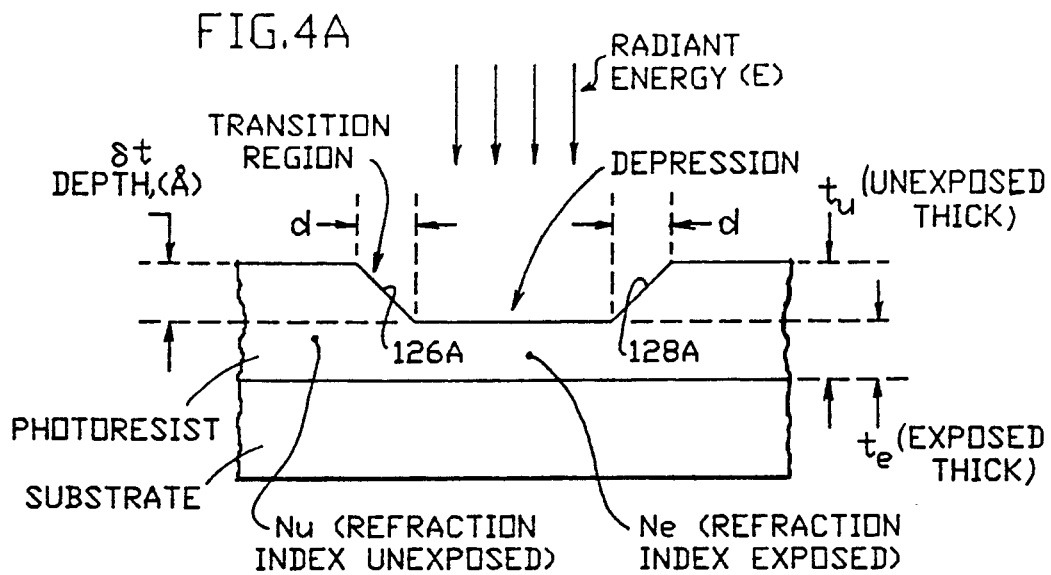
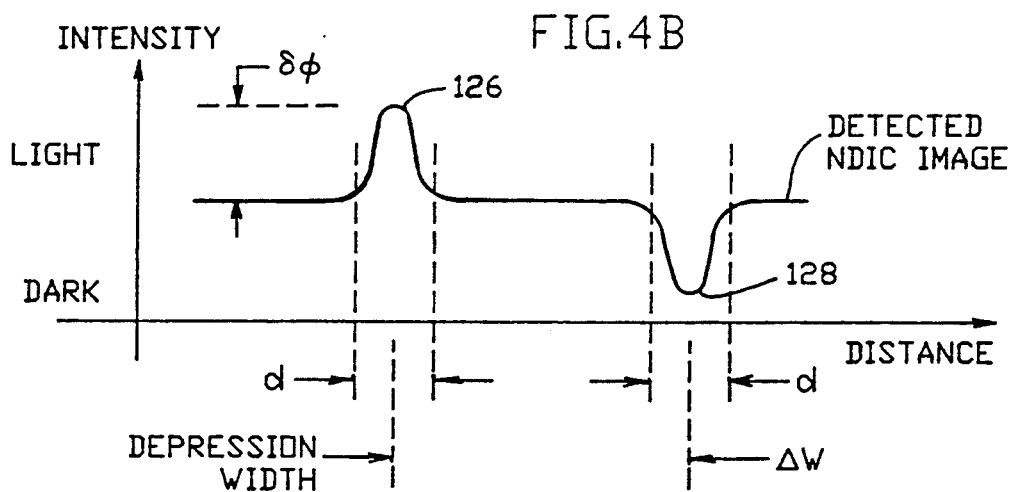
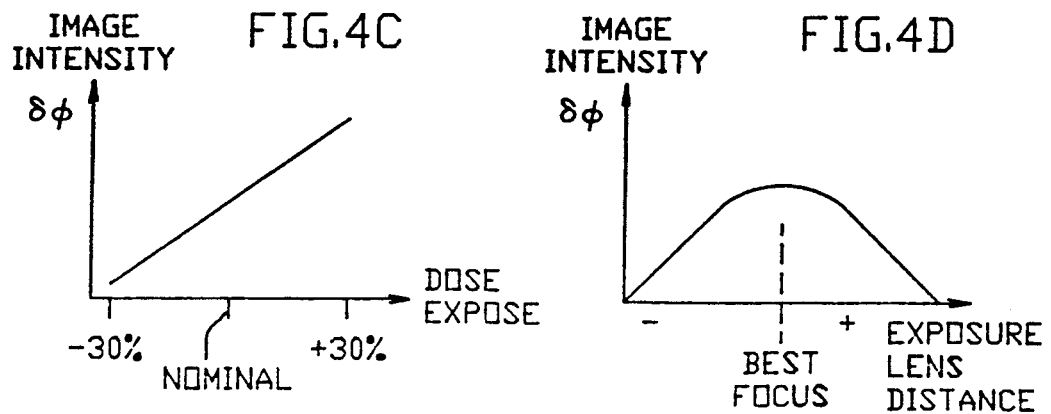

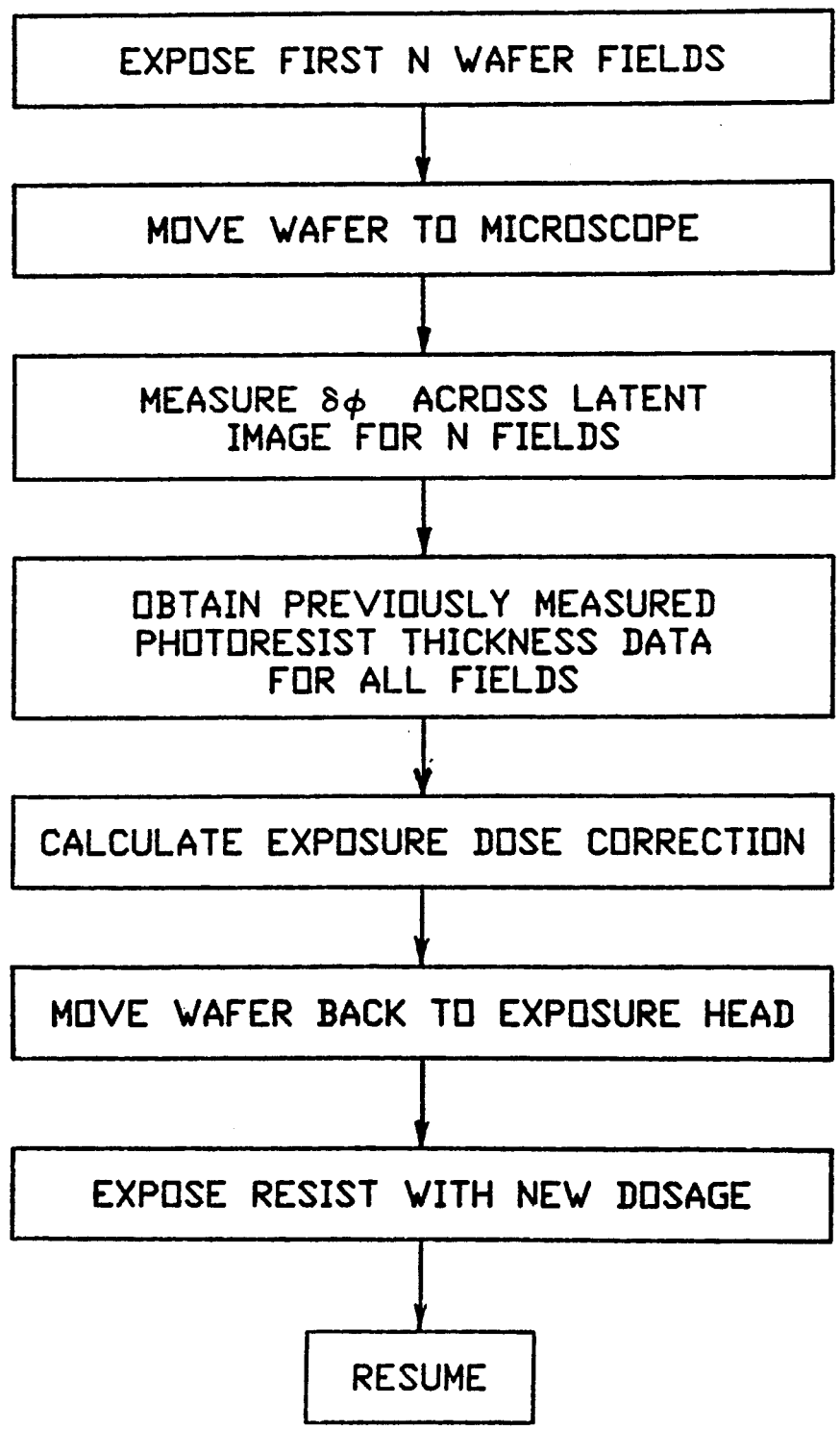

LATENT-IMAGE CONTROL OF LITHOGRAPHY TOOLS

BACKGROUND OF THE INVENTION

This invention relates to the construction of semiconductor devices and other layered devices by photolithography including steppers for displacing a semiconductor wafer relative to a mask or a reticle and, more particularly, to the use of latent images of alignment marks formed in a photoresist layer for increased precision in the locating of a wafer relative to a mask.

Numerous forms of semiconductor devices including integrated circuits, by way of example, are constructed by building up layers of material on a substrate, etching away portions of the material, followed by steps of deposition of other substances which may include dopants. The locations of the various materials are precisely controlled to insure an accurate formation of the various semiconductor structures. Typically, layers of photoresist are deposited and exposed by photolithographic apparatus including masks to delineate the forms, in two dimensions, of the desired structural elements. In the case of construction of numerous chips from a single wafer, a mask used in the construction of any one chip is also used for constructing the other chips. This is accomplished by stepping the wafer under an optical system including the mask for exposure of the individual wafer regions, or dies, of the respective chips. At each die, photoresist is exposed, typically with ultraviolet light by the optical system to form a latent image of the mask in a layer of photoresist. The wafer is then removed from the stepper, and developer is applied to the photoresist to develop the image. Etches selective to the development of exposed photoresist remove portions of the photoresist to prepare the wafer for the next stage of material deposition or other types of etching processes. At a later stage in the manufacture the wafer is returned to the stepper for exposure of the dies to another mask.

It is noted that the foregoing use of photolithographic apparatus in the printing of successive circuit patterns on the surface of a wafer can also be employed in the manufacture of reticles or masks is in the manufacture of semiconductor devices. Generally speaking, the use of the term mask is understood to include the term reticle or E-beam or maskless direct write control pattern for the purposes of the present invention.

To ensure accurate alignment of the wafer relative to the optical system, it is the practice in the initial stage of manufacture to produce tool registration aids on the wafer substrate in the marginal region surrounding each die, the registration aid being outside the product area of a die. A tool registration aid may be formed as a depression in the substrate surface, for example, wherein the aid is formed by an etch. A primary verification aid or mark may also be formed on the substrate. During subsequent steps in the manufacturing process, secondary verification marks located in the marginal region of a mask are projected onto a layer of photoresist and developed to allow alignment of the primary and the secondary verification marks.

The foregoing procedure presents a problem in that the verification marks imprinted in the photoresist must be observed in a manner which does not detract from the use of the photoresist in the process of imaging the details of an integrated circuit or other subject matter of the semiconductor device. Under present practice in which the verification marks imprinted on the photoresist are not usable until after the photoresist has been developed, the wafer is removed from the stepper, processed with a developing liquid, and then examined under a microscope to determine the degree of alignment between verification marks and registration marks. This wafer is known as a send ahead wafer, and must be reprocessed in the event that the alignment is poor. The stepper is then adjusted to correct the alignment, after which subsequent wafers can be processed by the stepper. The current practice is particularly inconvenient where relative few wafers are to be processed, and wherein frequent reticle changes may be required by a need to place several product patterns on a single wafer. The send-ahead wafer is a randomly selected product substrate from a batch. Alternatively, a monitor substrate which does not have a product being developed thereon may be employed to check alignment. In either case, the additional manufacturing steps represent a significant inconvenience.

SUMMARY OF THE INVENTION

The aforementioned problem is overcome and other advantages are provided by a manufacturing process employing a wafer stepper and photolithographic apparatus wherein, in accordance with the invention, a latent image of verification marks imprinted on a layer of photoresist is employed for alignment with registration marks previously produced on the substrate of a wafer. The invention is advantageous in that the latent image can be employed without the need for development of the exposed photoresist, thereby to preserve the latent image of subject matter for a product area on a die of the wafer. Therefore, alignment can be accomplished without removal of the wafer from the stepper. If inadequate alignment is found, the alignment can be corrected without removal of the wafer from the stepper with the result that only the first die, or a first plurality of dies, which dies have been exposed for the alignment process, have been lost while all the other dies on the wafer can now be exposed under conditions of correct alignment.

In accordance with a further embodiment of the invention, the latent image is viewed by an optical system employing illumination of the latent image with a photon energy lower than that required for exposure of the photoresist. Thereby, no alteration of the latent image occurs during the illumination. For example, where exposure of the photoresist to produce the latent image is accomplished by use of light in the deep ultraviolet region of the spectrum, the viewing of the latent image is accomplished with illumination with lower-frequency light in the near ultraviolet region of the spectrum.

In accordance with a further feature of the invention, examination of the latent image is accomplished with a microscope and further reticle elements operating in accordance with differential phase contrast, preferably Nomarski differential interference contrast. This produces a received beam of light in which changing depth and/or changing index of refraction of the photoresist layer produces an elliptically polarized wave which, upon being viewed through a polarization analyzer, produces variation in amplitude at the plane of a detector. The detector may be constructed as an array of charge-coupled devices (CCD) or a videcon which is scanned to extract data of a two-dimensional image at the plane of the detector. Variation in intensity across the detected image is stored as a set of pixels each represented as a multibit digital signal. The stored signal has at least several shades of gray to enable accurate observation of the blatant image.

An interesting feature of the optical processing by differential interference contrast (DIC) is the fact that the detected image shows a light region where the depth of the photoresist is decreasing and a dark region where the depth of the photoresist is increasing. Between these two regions, the image shows a medium value of gray. Exposure of the photoresist material to the ultraviolet radiation induces a slight decrease in thickness of the photoresist, and a change in the index of refraction. For example, a line having a width of two microns would appear in the detected image as a length of dark fringe spaced apart from a length of light fringe, the two fringes being spaced apart on centers by the foregoing width of two microns. The width of a fringe is a measure of the width of a transition region between the normal depth and refractive index, and the reduced thickness and altered refractive index.

In accordance with features of the invention, the foregoing characteristics of the DIC detected image permit convolution of the detected image and alignment with a reference image of verification marks to reduce the effect of noise on the determination of the precise location of the detected verification mark. Such noise results from, by way of example, deposits of aluminum and facets of polysilicon which may be present in the wafer. A comparison of the centroid of a detected secondary verification mark with the centroid of a primary verification mark produces a positional error signal which is used in connection with an error signal of a servomechanism of the stepper to refine the accuracy of the stepper. Similarly, the DIC detected image can be employed for enhanced global alignment in situations where verification marks for several dies are examined and averaged together to produce a position correction signal.

Also, in accordance with the invention, the strength of the detected image, specifically the intensity of a light or dark fringe, varies in accordance with the sharpness of focus of the exposing radiation. Therefore, examination of the detected image can be used to adjust the optical system for best focus. Furthermore, in view of the fact that the thickness and/or the refractive index of the exposed photoresist is dependent on the amount of exposure, namely the intensity and duration of the exposure, and is also dependent on the amount of heating in those photoresist materials which must be baked after exposure, examination of the detected image can also be used as a measure of exposure and a measure of baking.

It is to be noted that the theory of the invention for the measurement of parameters of the photoresist based on a viewing of a latent image in the photoresist is applicable to a variety of manufacturing situations in which a layer of photoresist is employed. The construction of multilayered semiconductor devices represents a common occurrence of a situation employing photoresist in the construction process. However, other important manufacturing situations, by way of example, relate to the configuration of ferroelectric materials in miniaturized recording heads, and the construction of masks and reticles used for constructing various devices. Accordingly, the methodology of the invention has applicability to diverse manufacturing processes, and is not limited to the construction of semiconductor devices. Nor is the invention limited to optical exposure tools but rather, encompasses E-beam, ion and X-ray exposure tools.

BRIEF DESCRIPTION OF THE DRAWING

The aforementioned aspects and other features of the invention are explained in the following description, taken in connection with the accompanying drawing wherein:

FIG. 1 shows a graphical representation of a typical patterned substrate with both plan and cross-sectional views of overlay patterns and latent image patterns, FIG. 1 being divided into four sections identified as FIGS. 1A-1D wherein FIG. 1A is a stylized view of a wafer, FIG. 1B is an enlarged view of one die of the wafer, FIG. 1C is an enlarged view of a square box-shaped primary verification mark surrounded by a similarly shaped secondary verification mark of a latent image, and FIG. 1D shows an L-shaped primary verification mark surrounded by an L-shaped secondary verification mark;

FIG. 2 is a diagrammatic view of optical equipment employed in the practice of the invention, the optical equipment including a modified Nomarski differential interference contrast (NDIC) microscope with autofocus and electro-optical phase modulator, the latter producing rotation of an optical connector;

FIG. 4 shows an imaging detector output resulting from response of the NDIC latent image for the measurement of exposure dose, tool focus, and direct latent image line width measurement, FIG. 4 being presented in four sections as FIGS. 4A-4D, and wherein FIG. 4A shows variation in photoresist thickness with exposure, FIG. 4B shows a differential image for the geometry of FIG. 4A, FIG. 4C is a graph of image amplitude as a function of exposure dosage, and FIG. 4D is a graph of image amplitude as a function of focus;

FIG. 5 is a flow diagram for real-time in-situ exposure monitoring and control;

DETAILED DESCRIPTION

Figure 3:
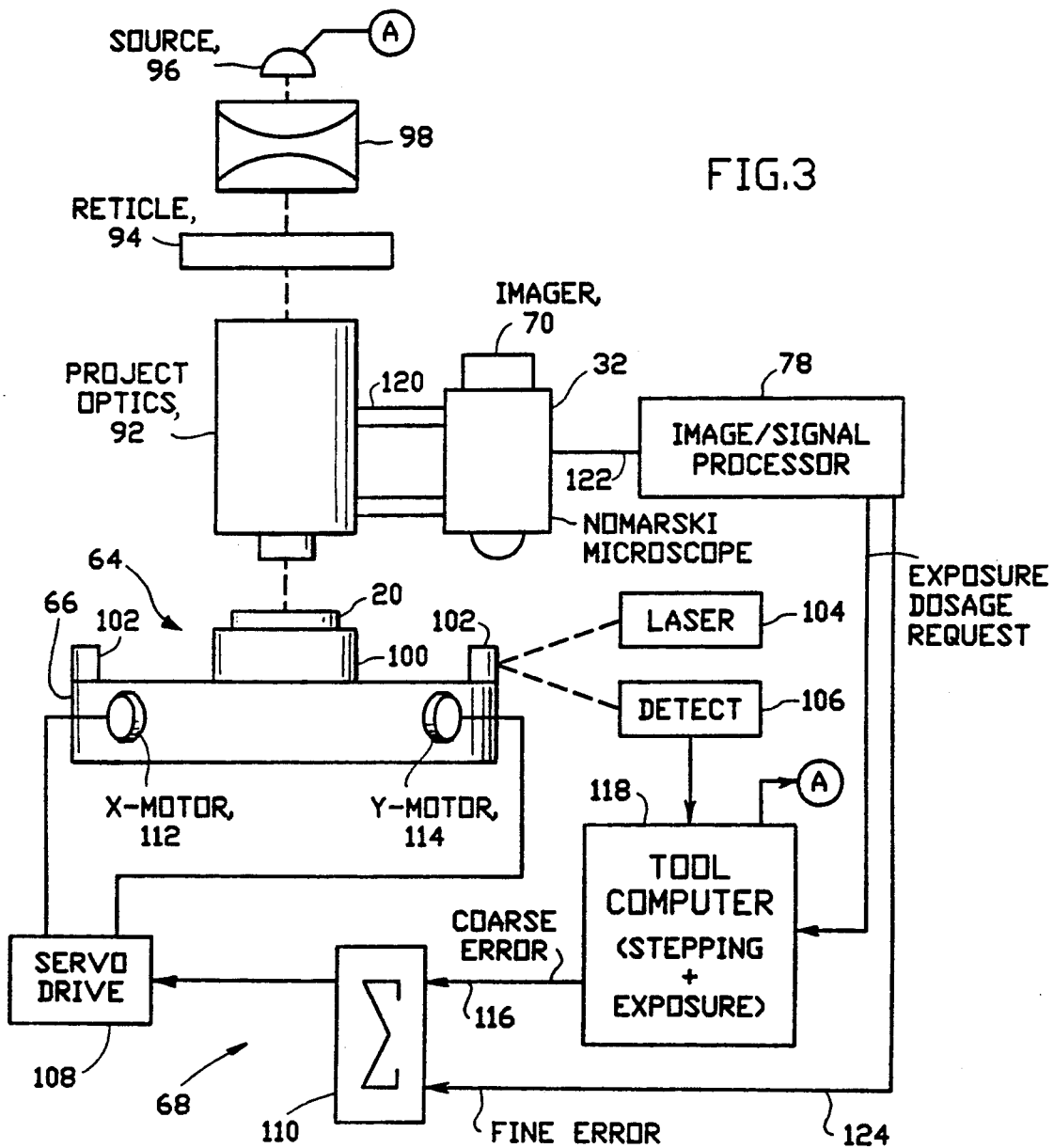
FIG. 3 is a diagrammatic view of a measurement subsystem of the invention integrated with a standard step and repeat microlithographic exposure tool.

FIGS. 1A–1D describe alignment marks employed in the practice of the invention for aligning a wafer 20 with a reticle or mask in photolithographic apparatus to be described hereinafter. FIG. 1A discloses a set of six dies 22 by way of example, it being understood that, in practice, hundreds of dies may be present in a wafer. Global alignment marks 24 are provided for initial alignment of the wafer 20 upon placing the wafer within a stepper of the photolithographic apparatus.

In FIG. 1B, in stylized view, a portion of the wafer 20 of FIG. 1A has been enlarged to show a die 22 and a marginal region 26 surrounding the die 22. Two primary verification marks 28 and two tool registration marks 28B are arranged about the die 22, within the marginal region 26, and formed directly within a surface of the wafer 20. In the practice of the invention, during a manufacturing step wherein a photoresist layer is disposed upon the wafer 20, secondary verification marks provided by a reticle or mask are projected onto the layer of photoresist. Two such secondary verification marks 30 are shown in FIG. 1B. The verification marks 30 may have a desired configuration, such as a square-shaped picture frame as shown in FIG. 1B, or an L-shaped configuration as shown by an alternative primary verification mark 28A and an alternative secondary verification mark 30A in FIG. 1D. The verification mark 30 or 30A is substantially larger than and encloses the verification mark 28 or 28A so that, upon an initial alignment of the wafer 20 with the stepper, provided by the optical system of the stepper as will be described hereinafter, the primary verification mark 28 or 28A falls within the secondary verification mark 30 or 30A. While the secondary verification mark 30 or 30A is shown to be larger than the primary verification mark 28 or 28A, it is to be understood that the relative sizes may be reversed such that the secondary verification mark would be made smaller than the primary verification mark (not shown) with the latter enclosing the former.

FIG. 1C shows further details in the conduction of the registration and the verification marks 28 and 30. Therein, the corner portion of the picture frame in each of the marks has been deleted leaving four straight segments of marking arranged in the square configuration. The four mark segments in each of the verification marks 28 and 30 are sufficiently long so as to provide overlap between the corresponding mark segments of the verification marks 30 and 28 even upon displacement of the centroids of the marks relative to each other, as might occur upon initial alignment of the wafer with the stepper. An offset between the centroid positions, as measured in an X coordinate, of an X-Y coordinate system, is also shown in FIG. 1C.

As will be disclosed hereinafter, upon a viewing of the verification marks 28 and 30 by a scanning of a detected image along a coordinate axis, for example the X axis, edge lines of a mark segment are noted by a change of intensity in the detected image, this being a characteristic of the Nomarski differential interference contrast response of the microscope system employed in viewing the marks. Such an NDIC response is also indicated in FIG. 1C for the situation in which a scanning of the detected image is accomplished along a scan line parallel to the X axis and intersecting a portion of the verification mark 30 which is parallel to the Y axis.

FIG. 2 shows an optical system 32 employed by the invention for accomplishing a fine measurement of offset between primary and secondary verification marks, which fine measurement is to be employed by stepper positioning apparatus to accomplish a more accurate locating of the wafer within the stepper. The optical system 32 includes a source 34 of light, typically near ultraviolet, a condenser lens 36 for collimating rays of light from the source 34, and a rotator 38 of the electric vector of collimated light incident upon the rotator 38 from the lens 36. The rotator 38 comprises an electrooptic liquid crystal phase shifter which introduces phase shifts differentially to orthogonal components of the electric vector of the light incident upon the rotator 38 from the lens 36. The amount of differential phase shift is established in response to a voltage applied to the rotator 38 from a voltage controller 40. The output beam of light from the rotator 38 is indicated by line 42.

The optical system 32 further comprises a vidicon 44, a polarization analyzer 46, a half-silvered mirror 48 comprising a glass plate 50 with a layer 52 of silver disposed on a surface of the plate 50, a Nomarski modified Wollaston prism 54 comprising two prismatic elements 56 and 58 which meet along an interface 60, and a microscope objective 62. Also shown in FIG. 2 are components of a stepper 64, namely a stage 66 (shown in simplified form) for supporting the wafer 20 in front of the objective 62, and a servo unit 68 for positioning the stage 66 to align the wafer 20 in accordance with command signals developed by use of the optical system 32.

The vidicon 44 is provided by way of example as a detector of an image of subject matter of the wafer 20, it being understood that another form of area detector, such as a charge coupled device, may be employed instead of the vidicon 44. The vidicon 44 constitutes a part of an imager 70, the imager 70 further comprising scan control unit 72 and a digitizer 74 which are connected to the vidicon 44, and a memory 76 such as a random access memory connected to an output terminal of the digitizer 74. The scan control unit 72 directs th vidicon 44 to perform a raster scan of an image incident upon the vidicon 44 so as to enable the vidicon 44 to output data of the image as a sequence of scan frames each of which provides image data in the form of a sequence of scan lines. Data outputted by the vidicon 44 is sampled by the digitizer 74 and converted to a sequence of multibit digital words, for example, 8-bit words, which are applied to the memory 76 to be stored therein. An image/signal processor 78 which includes a computer 80 and timing circuitry 82 outputs timing signals for synchronizing operation of the scan control unit 72 and the digitizer 74. In addition, the processor 78 addresses the memory 76 for obtaining data from the memory 76. Furthermore, the processor 78 applies a signal to the voltage controller 40 for designating an amount of phase shift to provide a requisite amount of rotation of the electric vector during the process of generating an image of subject matter on the wafer 20.

In operation, rotator 38 rotates the position of the electric vector by 90 degrees in alternating fashion so that the analyzer 46 can be used to observe received radiation at 45 degrees relative to the Wollaston shear direction of the prism 54 during one frame of the scanning of the vidicon 44, and during the next frame, by viewing the incident radiation at an angle of 135 degrees relative to the Wollaston shear direction. The foregoing viewing angle alternates concurrently with successive ones of the scanning frames. This improves the image as will be described hereinafter.

The beam on line 42 reflects off the mirror 48 to propagate through the prism 54 and the objective 62 to reflect from the wafer 20 back through the prism 56 and through the mirror 48 and the analyzer 46 to the vidicon 44. At the Wollaston prism 54, the portion of the radiation on line 42 which is reflected via line 84 to the prism 54 is divided into two parallel beam 86 and 88 which then illuminate the wafer 20. The spacing between the beams 86 and 88 determines the resolution of the optical system 32. In addition to being spaced apart, the radiations in the two beams 86 and 88 are linearly polarized and orthogonal to each other. Differential phase shift between the two beams is established by the Wollaston prism to typically 90 degrees. During the propagation of the radiation of the two beams 86 and 88 along the reflected paths back from the wafer 20, the two beams 86 and 88 are combined by the prism 54 to a single beam on line 84. The reflected single beam on line 84, after exiting the mirror 48 on line 90, has an energy equal to approximately one-quarter of the energy of the beam on line 42 (neglecting any absorption of energy at the wafer 20) because the mirror 48 is a half-silvered mirror wherein half the energy is lost at each reflection.

As will be explained hereinafter, exposure of the wafer 20 produces changes which affect the path length of the incident radiation such that the beams 88 and 86, upon reflection from the wafer 20, will experience different phase shifts. Therefore, the composite reflected beam on lines 84 and 90 has components which are spatially shifted by 90 degrees, phase quadrature, plus the 90 degree phase shift from the Wollaston prism, plus differential phase shift by virtue of striking different parts of the wafer. As a result, radiation on line 90 is elliptically polarized, and the analyzer 46 converts the phase variation to amplitude variation for presentation to the vidicon 44.

FIG. 3 shows details of the stepper 64 including projection optics 92, a mask or reticle 94, source 96 of light, typically deep ultraviolet, and condenser lens assembly 98 which collimates light from the source 96 and directs the light through the reticle 94 and the projection optics 92 to illuminate the wafer 20. The wafer 20 is held by a chuck 100 to the stage 66. Position indicating devices 102 are located on the stage 66 so that, upon illumination of the devices 102 by a laser 104 and detection of reflected radiation by a detector 106, the x and the y coordinate positions of the stage 66 can be determined in accordance with-known practice. In addition, a z-axis displacement, parallel to the axis of the projection optics 92, and with detection of the z-axis position, is provided in accordance with well-known practice. The z-axis coordinate has been deleted in FIG. 3 to simplify the drawing.

The servo unit 68 of FIG. 2 is disclosed in further detail in FIG. 3 wherein the servo unit 68 is shown to include a servo drive 108 and a summing circuit 110. Two motors 112 and 114 are energized by the servo drive 108 and serve to position the stage 66 along the x coordinate and the y coordinate, respectively. The servo drive 108 includes well-known amplifiers and filters (not shown) for providing the desired dynamic response to the stepper 64 for positioning the stage 66 in response to an error signal on line 116 produced by a computer 118. The computer 118 is responsive to position signals of the detector 106 for generating the requisite error signal on line 116 to drive the stage 66 to a position of alignment with the reticle 94. The computer 118 also connects via terminal A to the source 96 for activating the source 96 to expose photoresist on the wafer 20. A connection is also provided between the processor 78 and the computer 118 for transmitting a request for exposure dosage from the processor 78 to the computer 118.

In accordance with the invention, the optical system 32 and the imager 70 of FIG. 2 are attached to the projection optics 92 by struts 120 in FIG. 3. The processor 78 of FIG. 2 is employed with the system of FIG. 3, the processor 78 being connected by a cable 122 to the optical system 32 and the imager 70 for outputting an error signal on line 124 to the servo unit 68. More specifically, the line 124 is connected to an input terminal of the summing circuit 110 so that signal outputted by the summing circuit 110 to the servo drive 108 contains components of the relatively coarse error signal on line 116 and the relatively fine error signal on line 124. The signal on line 124 is present only during adjustment of the wafer 20 by use of the latent image of the verification marks 30 (FIG. 1). During this fine adjustment of the wafer position, the error signal on line 116 has a near-zero value while the error signal on line 124 is significantly larger for driving the servo unit 68 to position the stage 66.

By way of alternative embodiments of the invention, it is noted that differential phase contrast can be obtained also by use of the projection optics 92, if suitable optical connection is made therewith.

FIG. 4A shows the effect of exposure of a layer of photoresist to radiant energy E directed upon the surface of the photoresist. The photoresist is disposed as a layer on a substrate. FIG. 4A indicates the initial thickness of the photoresist layer which is maintained in areas which are not exposed to the radiant energy. In the region of exposure, the thickness of the photoresist layer has been reduced to form a depression. Furthermore, there are two indices of refraction, namely, the index of refraction in regions of the photoresist which have not been exposed to the radiant energy, and the index of refraction in the exposed area. FIG. 4A also shows a transition in thickness between the exposed and the unexposed areas, the transition being shown as an inclination in the top surface of the photoresist, the transition having a width d, there being a transition region on both sides of the depression. Also indicated in FIG. 4A, the change in thickness or depth of the trench, resulting from the exposure to the radiant energy. The change in thickness is important for use of the optical system 32 of FIG. 2 because the two beams 86 and 88 impinge upon different parts of the transition region and of the depression. As a result, the optical path lengths differ resulting in a difference of phase shift imparted to reflections of the beams 86 and 88. Also, it is noted that the differing indices of refraction contribute to the differential phase shift experienced by the beams 86 and 88. The depression is shown in exaggerated form to demonstrate the principals of the invention. The latent image of a mask or reticle produced by the projection of the shape of the mask or reticle upon the photoresist is composed of exposed areas, each of which resemble the depression of FIG. 4A. Accordingly, while the latent image is invisible to normal inspection, it becomes visible upon use of the optical processes of the invention.

By way of example in the formation of the depression of a latent image, in the case of a diazo based polymer photoresin for use as the layer of photoresist, exposure would be done with ultraviolet radiation at a wavelength of approximately 350 nanometers (nm) provided by the source 96 of FIG. 3, while viewing of the latent image would be accomplished with radiation at a wavelength of approximately 550 nm, produced by the source 34 of FIG. 2. In the case of an acid catalyzed resist, the layer of photoresist is sensitized to a radiation having a different wavelength. More specifically, the acid catalyzed resist is sensitive to the deep ultraviolet at 240 nm, provided by the source 96 of FIG. 3, for exposing the latent image and to radiation of a wavelength greater than 300 nm, provided by the source 34 of FIG. 2, for viewing the latent image. By way of example in the construction of a latent image, with reference to FIG. 1C, the width and length of a segment of the verification mark 30 are approximately equal, respectively, to two microns and ten microns.

FIG. 4B shows the result of an image produced by the optical system 32 of FIG. 2 upon an image plane at the vidicon 44. Since an image is produced where the wafer subject matter introduces differential phase shift for the beams 86 and 88 of FIG. 2, the result is that an element of the image appears at each transition region of the depression. The differential phase measurement produces a shift in the amount of darkness of the gray scale dependent on the slope of the transition region. Thus, the detected image shows a positive peak 126 corresponding to the transition slope 126A which slopes downward and to the right in FIG. 4A. A peak 128 of the opposite sense results from the corresponding transition slope 128A which slopes downward and to the left. Thus, the peak 126 shows a bright spot in the image plane while the peak 128 shows a dark spot, with remaining portions of the image depicted in FIG. 4B having a medium level of the gray scale. The width of the peaks 126 and 128 are approximately equal to d, the widths of the corresponding transition regions. The spacing between the peaks 126 and 128 serves as a measure of the width of the trench.

FIG. 4C shows that the image intensity, proportional to the phase difference under conditions which will be explained hereinafter, is proportional to the exposure dosage of the photoresist to the incident radiation. Thus, for a nominal amount of dosage, a nominal intensity to the peak 126 or 128 (FIG. 4B) results.

For a more shallow depression resulting from reduced exposure, there would be less phase shift between the viewing beams 86 and 88 (FIG. 2) incident upon exposed and unexposed portions of the surface of the photoresist. At greater dosage, the geometry of the depression creates a greater difference in phase between the beams 86 and 88. A substantially linear relationship is obtained over a dosage exposure range of approximately 2:1.

FIG. 4D shows that the image intensity also varies in response to the sharpness of focus of the projection optics 92 of FIG. 3. In case of poor focusing, the peaks 126 and 128 would be reduced in amplitude because the inclination of the corresponding slopes 126A and 128A would be reduced. Maximum slope is obtained for best focus and, produces the greatest change in phase. Accordingly, the graph in FIG. 4D has a convex shape.

FIG. 5 demonstrates the use of the apparatus of FIG. 3 for practicing a procedure of the invention, this procedure being the correction of an exposure dosage wherein the projection optics 92 is held at a constant focus. The procedure begins with an exposing of the set of N wafer fields or dies, such as the die 22 of FIG. 1A. The exposure is accomplished with the projection optics 92 and the stepper 64. The number N may be 1, 2, 3, or higher number. After exposure, the wafer is moved to the microscope employing the optical system 32 and the image 70 in cooperation with the processor 78. The microscope is employed to measure the differential phase, or image intensity, across the latent image in each of the selected N fields, Preparatory to performing calculations, previously measured photoresist thickness for each of the fields is entered into the computer 80 of the processor 78. Thereupon, calculation of exposure dose correction is made by the computer 80. The calculation is accomplished by solving equations as will be described hereinafter which equations are readily solved on the computer by using known techniques. Thereupon, the wafer is moved back to the exposure head of the projection optics 92, and the source 96 is activated to expose the photoresist with the new dosage. The photoresist is now properly exposed and, accordingly, the manufacture process can be resumed.

Figure 6:
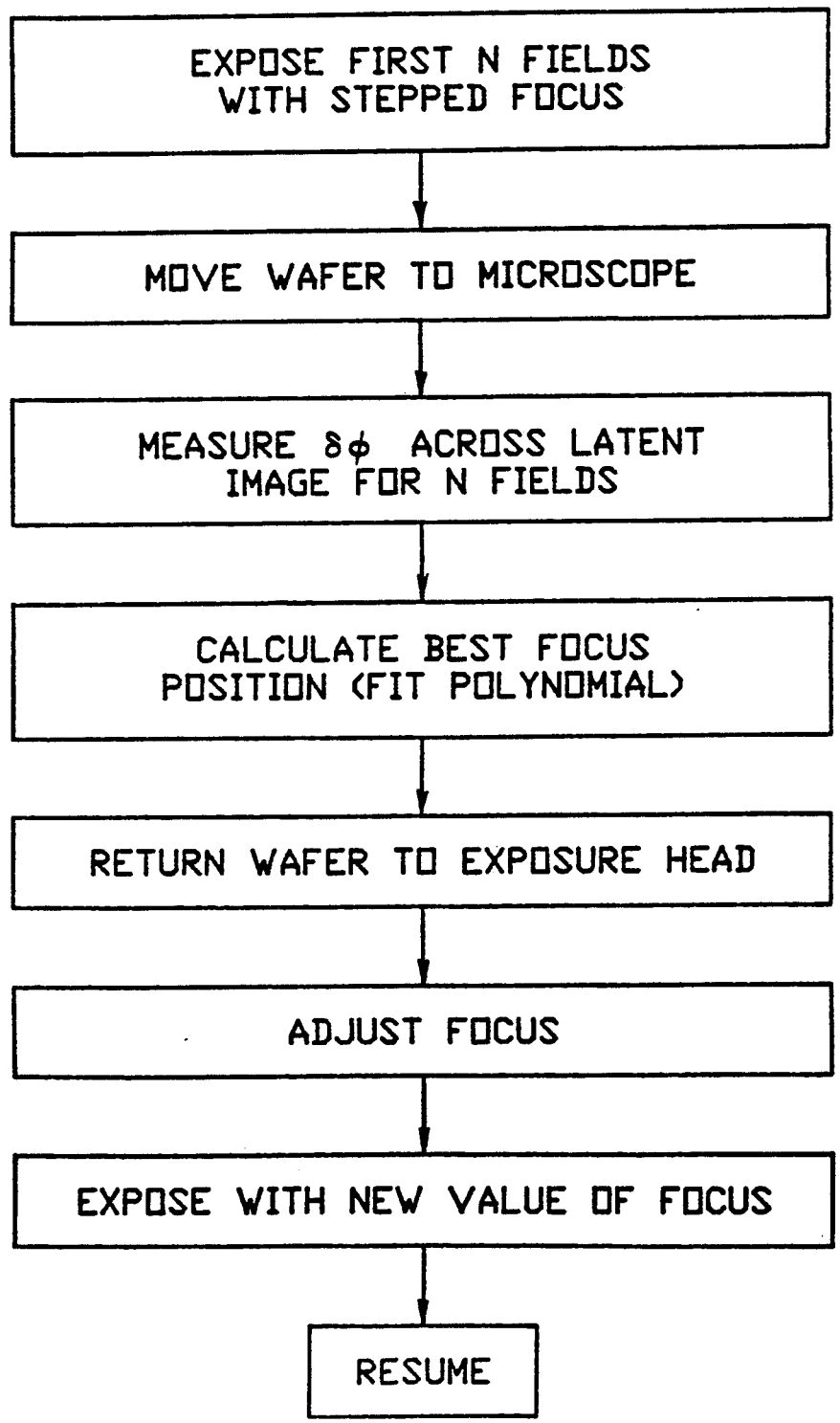
FIG. 6 is a flow diagram for real-time in-situ focus monitoring and control.

FIG. 6 demonstrates a further procedure of the invention employing the same equipment which was employed in the procedure of FIG. 5. The procedure of FIG. 6 is used to correct the focus of the projection optics 92 in a situation wherein the exposure is maintained constant. The procedure begins with an exposing of the first ten fields, or dies 22 of FIG. 1A with stepped focus by use of the stepper 64 of FIG. 3. Thereupon, the wafer is moved to the microscope which is employed to measure the differential phase, or image intensity, across the latent image in each of the N fields. Then, the computer 80 of the processor 78 is employed to calculate the best focus position by mathematical procedure employing the best fit of a polynomial. The mathematics will be described hereinafter. The wafer is then returned to the exposure head of the projection optics 92. The projection optics 92 is refocused to the new value of focus after which the exposure is resumed with the new value of focus. The photoresist is then properly exposed and, accordingly, the manufacturing procedure for the construction of a semiconductor device can be resumed.

Figure 6A:
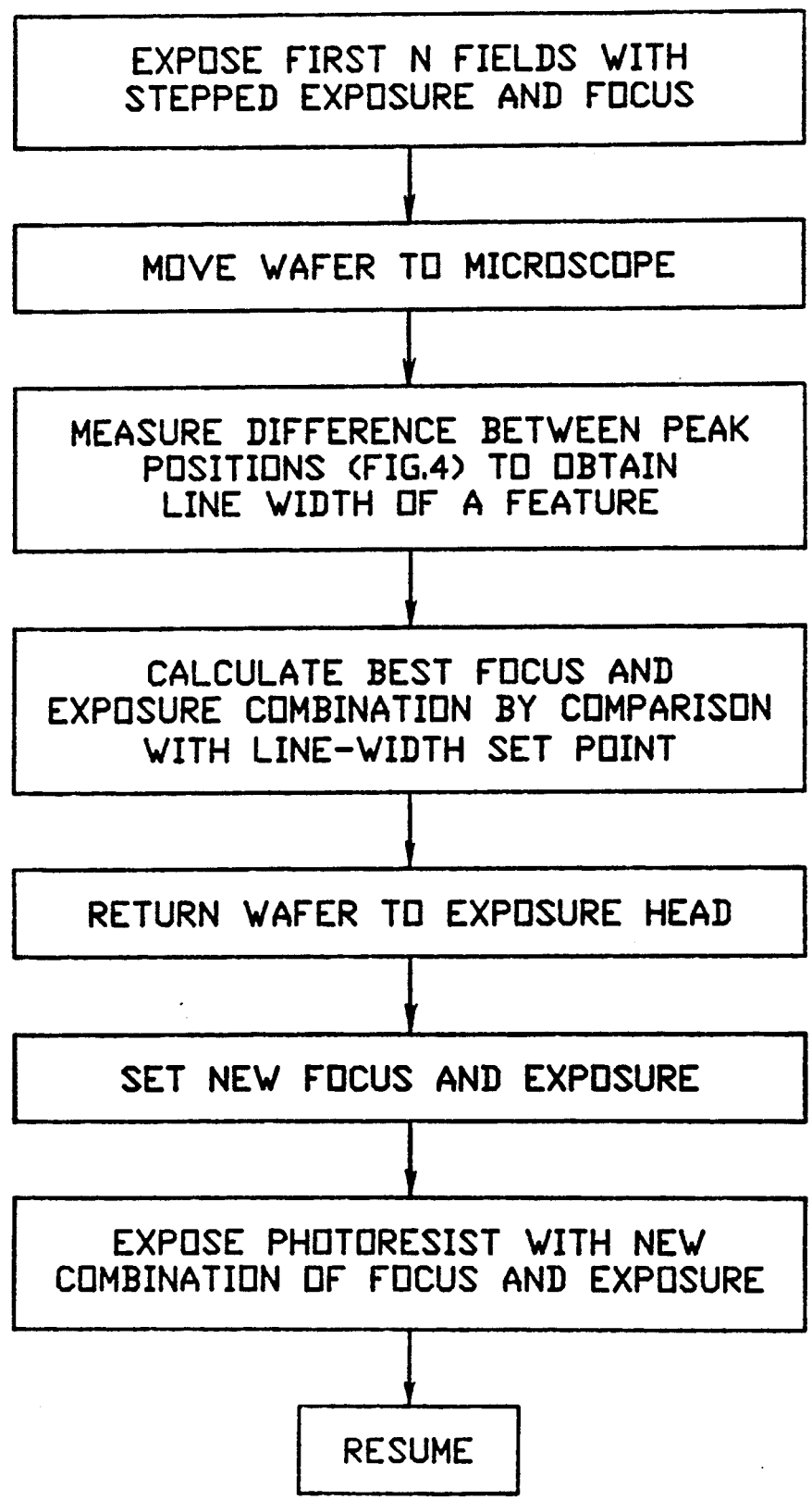
FIG. 6A is a flow diagram for direct measurement of latent image line-width.

FIG. 6A presents the procedure for measuring the line width in a latent image. This is accomplished most readily by use of a product characterization aid in which a sample line is constructed in the marginal region 26 (FIG. 1B) so that an observation can be made of a long line at a point of convenience, rather than by searching for a line in the complex pattern of the product area. If desired, such a product characterization aid can be located in the product area at a predetermined location which facilitates a finding of the characterization aid. For example, the characterization aid can be constructed as the line segment similar to that employed in the construction of the verification marks 28 and 30 (FIG. 1C). Since the same optics and source of radiant energy is employed for exposing the characterization aid and the product area itself, the line width obtained for the product characterization aid can be presumed safely to indicate the line width obtained for similar lines formed within the product area. The procedure of FIG. 6A is intended to be employed with a product characterization aid.

The procedure begins with an exposing of the first N fields, or dies, with stepped exposure and focus employing the equipment of FIG. 3, as was the case with the previously disclosed methods. Thereupon, the wafer is moved to the microscope to obtain the differential phase image, such as that disclosed in FIG. 4B. It is noted that the digitized data of the image is stored at predetermined locations within the memory, there being one location for each pixel. The number of pixels, or data samples, between the location of the peak 126 and the peak 128 is a measure of the width of the line, or depression with reference to FIG. 4A. The measured line width is then used to calculate the best combination of focus and exposure by comparison of the measured line width with a reference line width or set point. The wafer is then returned to the exposure head and the new values of focus and exposure are set. Thereupon, the photoresist is exposed further with the new combination of focus and exposure to produce the desired line width. Thereafter, the manufacturing process can be resumed.

Figure 7:
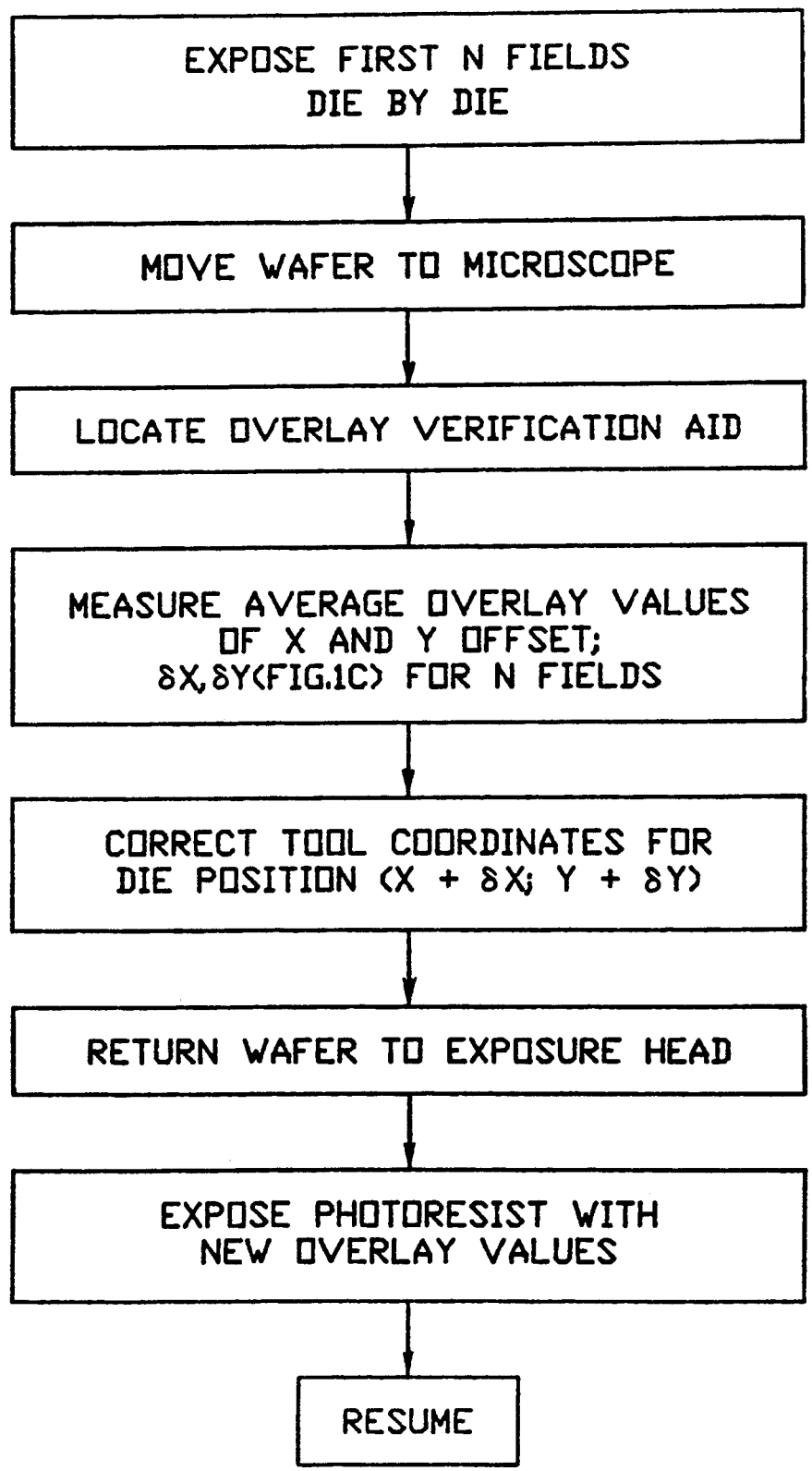
FIG. 7 is a flow diagram for real-time in-situ overlay monitoring and control.

FIG. 7 demonstrates a method of correcting the alignment of the wafer with a mask or reticle by use of the verification aids disclosed in FIGS. 1B and 1C. The procedure employs the apparatus of FIG. 3 as is the case for the previously disclosed procedures. The procedure begins with an exposing of the first N fields by sequentially exposing the selected dies. Then the wafer is moved to the microscope which is employed to locate an overlay verification aid. With reference to FIG. 1C, there is shown the X component of an offset between the centroid of the verification mark 28 and the centroid of the verification mark 30. A corresponding offset may exist in the Y coordinate of the X-Y coordinate system. In any one coordinate, the center of either of the verification marks is obtained by noting the location, in terms of number of pixels in the image, to the midpoint between opposite mark segments. The procedure of the invention provides for a measurement of the X offset and the Y offset in the verification marks for each of the selected dies, and obtaining an average measure of the overlay values of offset. This average overlay offset is then used to correct the two coordinates by feeding the additional error signal along line 124 (FIG. 3) to the servo unit 68 to position the stepper stage 66 more accurately. The wafer is returned to the exposure head by use of the corrected coordinates, and the photoresist is exposed under the conditions of the new overlay values. The manufacturing process can then be resumed.

Figure 8:
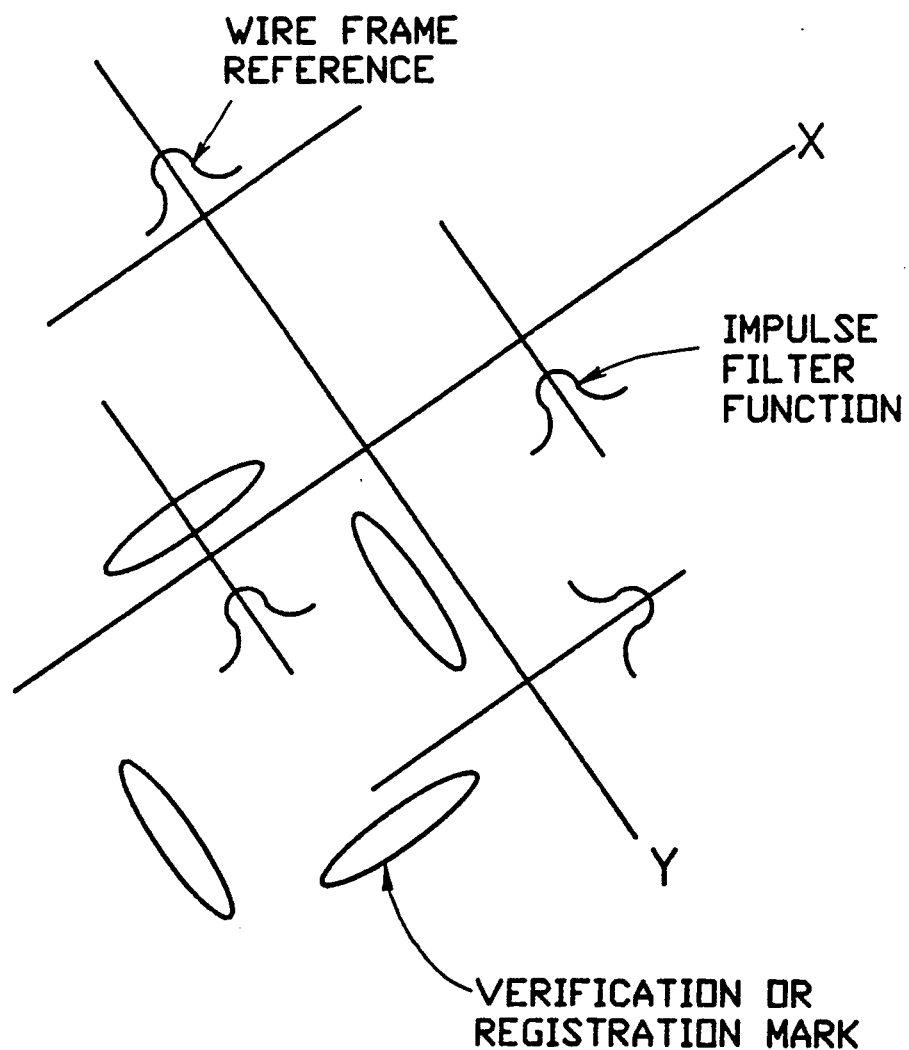
FIG. 8 is a diagrammatic view of a wire-frame, or reference pattern, used as a standard for convolution in an overlay position-determining algorithm, the view showing also representative results of a convolution calculation.

FIG. 8 demonstrates the location of the centroid of the verification or registration mark by correlation of the mark in two dimensions with a reference mark, indicated as a wire frame, by analogy with the picture frame of FIGS. 1B and 1C. As noted in the discussion of FIG. 7, reference was made to the measurement of the center of a verification mark by noting the locations of the mark segments obtained by the peaks 126 and 128 (FIG. 4B) for each of the mark segments. Such mark segments are illustrated in stylized form in FIG. 8. However, a more accurate method is to convolve the entire image with a reference image. The peak value of the convolution occurs upon coincidence of the image and the reference, the location of coincidence being the location of the centroid of the mark. In this respect, the convolution response may be likened to the impulse response filter function for each of the various elements, as indicated in FIG. 8. The actual mathematical equations to be solved by the computer 80 (FIG. 2) in accomplishing the convolutions will be described hereinafter.

Figure 9:
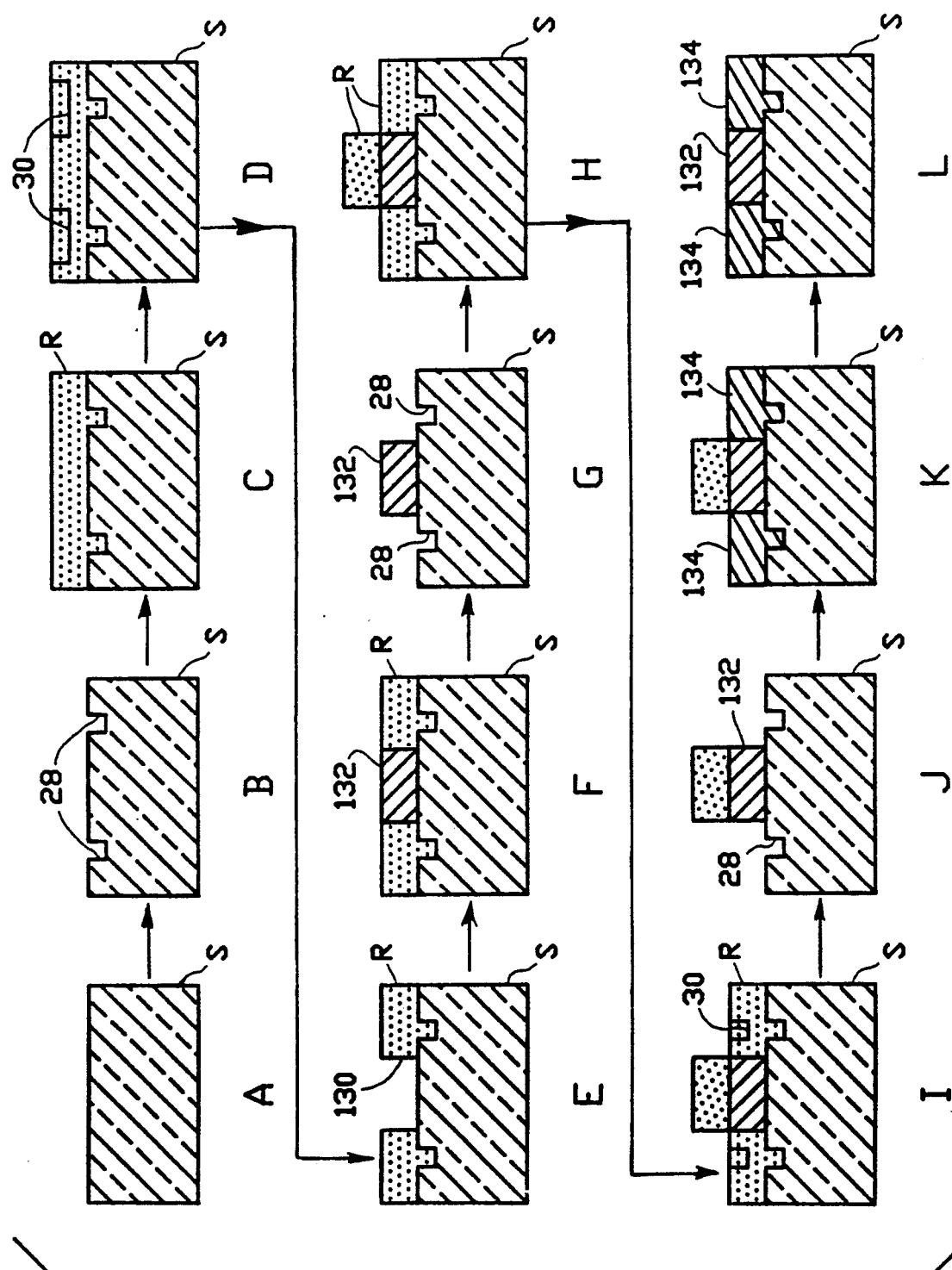
FIG. 9 is a stylized representation of successive steps employed in the formation of layers of material for the construction of a semiconductor device, such construction being advantageously implemented by the invention.

FIG. 9 demonstrates manufacturing steps in constructing the device comprising, by way of example, multiple metallic elements upon a nonmetallic substrate S. The procedure involves the use of photoresist R and includes, furthermore, the use of the primary verification marks 28 and the secondary verification marks 30 for employing methodologies disclosed herein. By way of example, FIG. 9 shows twelve manufacturing steps labeled A-L. At step A, the substrate is prepared. Then, in step B, the stepper apparatus of FIG. 3 is employed to produce the verification marks 28 by etching the marks in the top surface of the substrate S. Thereupon, the top surface of the substrate, in step C, is covered with a layer of photoresist R. In step D, the reticle 94 with its associated optics are employed to produce a latent image of verification marks 30 in the top surface of the photoresist, shown in step D. Also, in step D, a pattern for a product area is produced as a latent image on the photoresist R. At step E, the photoresist is developed as the exposed area is washed away to leave a void 130.

The manufacturing process continues at step F by a filling in of the void 130 by depositing metal to produce a metal slug 132 on the top surface of the substrate S. At step G, the remaining portion of the photoresist is etched away, and at step H, a new layer of photoresist R is deposited on top of the slug 132 and the adjoining top surface of the substrate S. At step I, verification marks 30 are formed as latent images in the photoresist R. The verification marks 30 in combination with the verification marks 28 may be used to align the substrate with the optical system of the stepper 64 of FIG. 3. Thereafter, the manufacturing process can continue with exposure of portions of the photoresist to the sides of the slug 132. Then, at step J, the photoresist is developed and washed away at the sides of the slug 132. Then, in step K, the second metal is deposited as shoulders 134 on both sides of the slug 132. Finally, at step L, the remaining portion of the photoresist R is removed from the top of the slug 132 to provide the finished product comprising a central metal slug 132 set between metal shoulders 134 on the substrate S.

Figure 10:
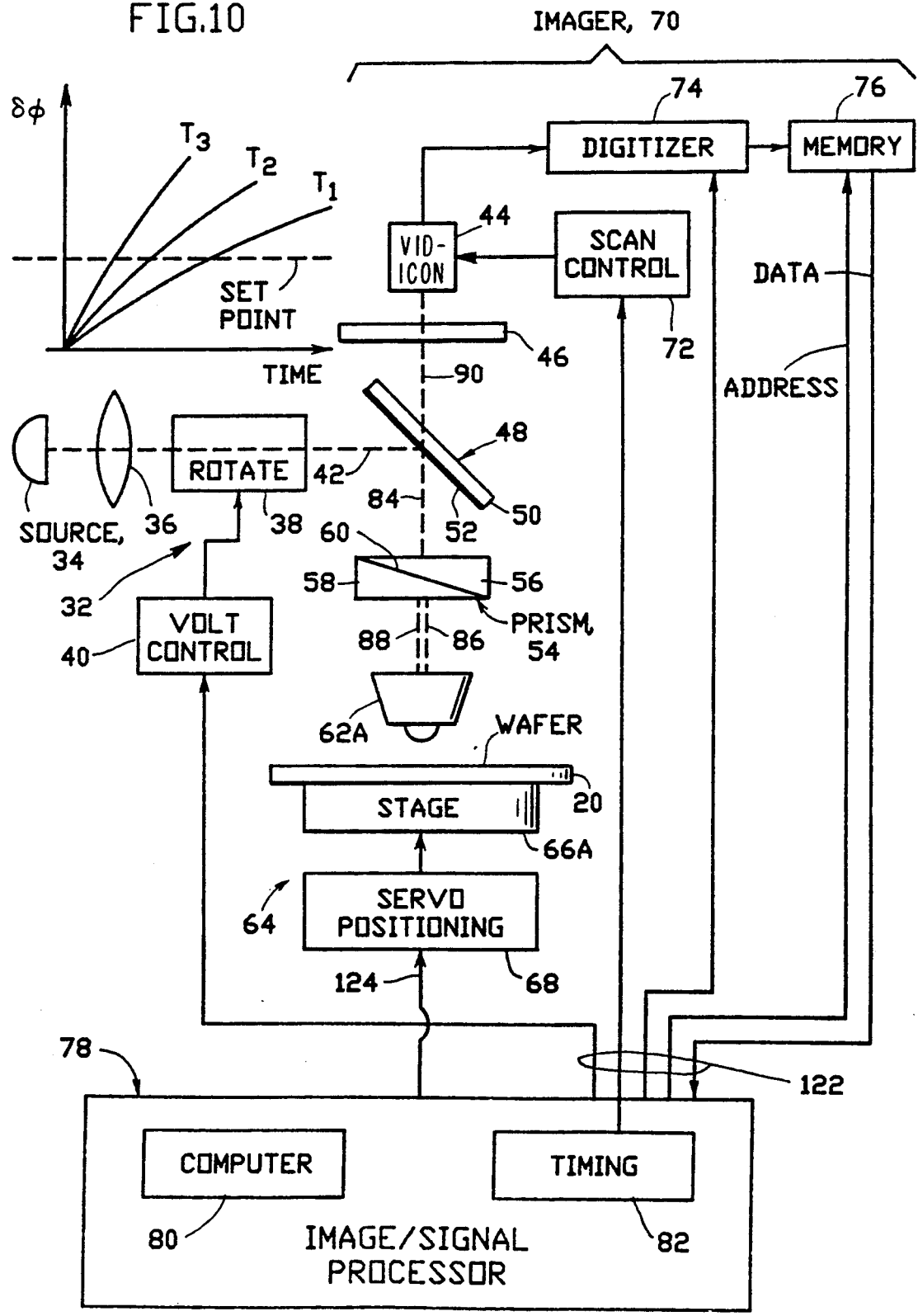
FIG. 10 is a diagrammatic view of a photoresist post-exposed bake thermal developer station.

FIG. 10 shows apparatus similar to that of FIG. 2 but different from FIG. 2 in that an objective 62A allowing for a long working distance from the subject matter of the wafer 20 is employed in FIG. 10. This allows for a heating of the wafer 20 and photoresist thereon in a baking process, the longer working distance protecting the objective 62A from any particles which may be ejected from the heated photoresist. A stage 66A incorporating a heater is employed in FIG. 10 for heating the wafer 20 and the photoresist (not shown) on the wafer surface facing the objective 62A.

As is well known, various materials may be employed in the construction of photoresist. Some of these materials require a baking stage followed by a cool down, or quench, after exposure to light for production of the image of the mask. The amount of baking, including both the temperature and the duration in the baking interval are effective in altering the depth and refractive index of the photoresist as does the exposure to the ultraviolet radiant energy. Therefore, the apparatus of FIG. 10 can be employed to measure the adequacy of the bake cycle in a manner similar to that of the evaluation of the exposure cycle. This is indicated in the graph appended adjacent th analyzer 46 in which a set point indicating a desired amount of baking can be reached more rapidly by use of a higher temperature, the three indicated temperatures T1, T2 and T3 being of increasing value. The vertical axis of the graph indicates the differential phase shift which would be obtained upon a viewing of the photoresist subsequent to the baking process.

Figure 11:
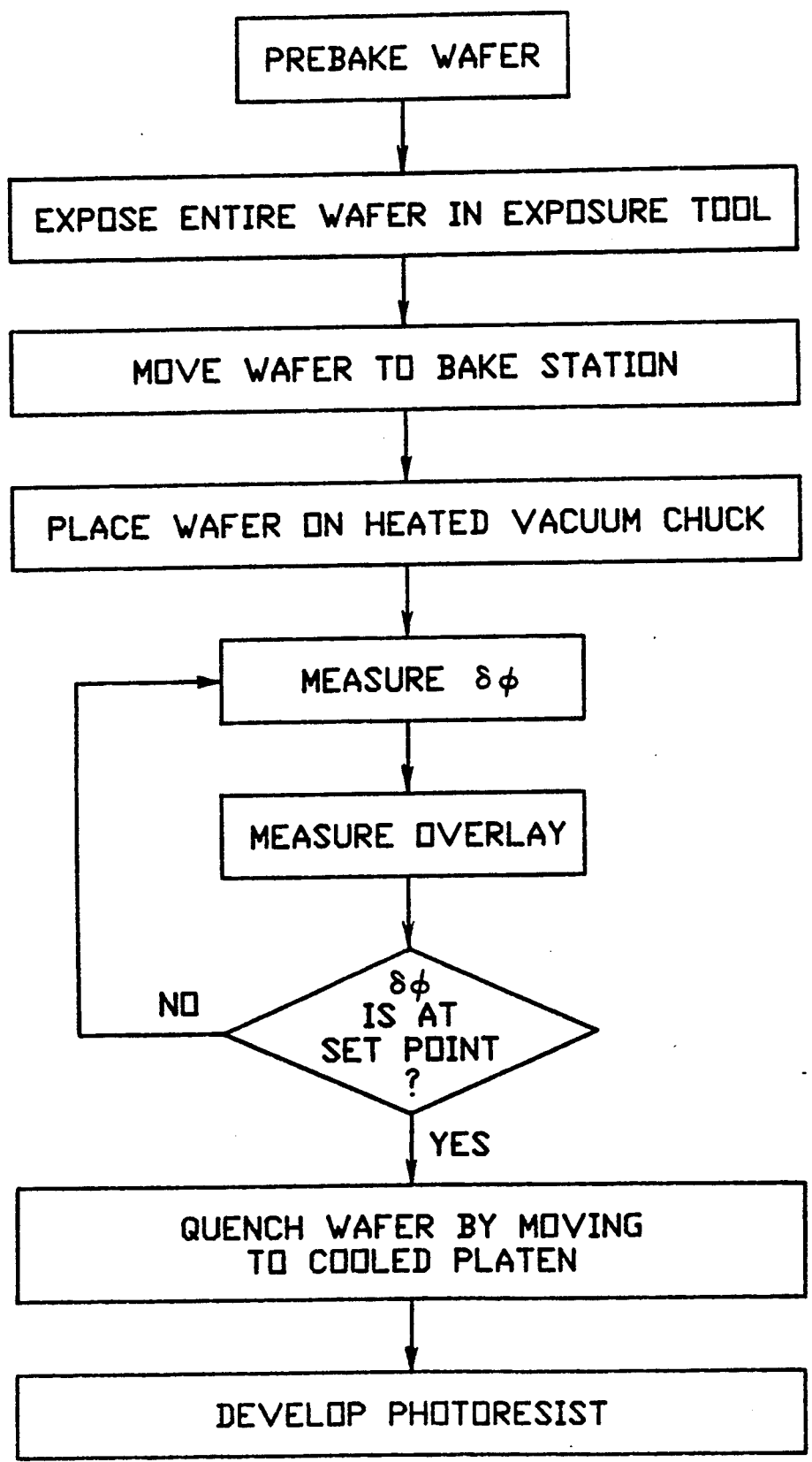
FIG. 11 is a graphical representation of an NDIC image ratio as a function of bake time for a thermal developer station.

FIG. 11 demonstrates use of apparatus of FIGS. 2 and 3 for evaluating the bake cycle. The procedure begins with a prebake of the wafer. Thereupon, the entire wafer is exposed in an exposure tool, such as that of FIG. 3. Then the wafer is moved to the bake station. The wafer is placed on a heated vacuum chuck. The optical system of FIG. 2 is then employed to measure differential phase shift as manifested in the image presented to the vidicon. In addition, measurement is made of the alignment of the overlay relative to the registration marks. A determination can then be made whether the differential phase shift is at the set point designating that the changes in thickness and/or reflective index conform to that which is attained in a proper bake cycle. If the set point has not been attained, the heating on the heated vacuum chuck continues, in which case a further measurement of differential phase shift and alignment of the overlay, namely the mask with its verification marks, may show an increased value of differential phase shift. Assuming that the differential phase shift has reached its set point, then the wafer is quenched by moving the wafer to a cool platen after which the photoresist is developed with it.

Figure 12:
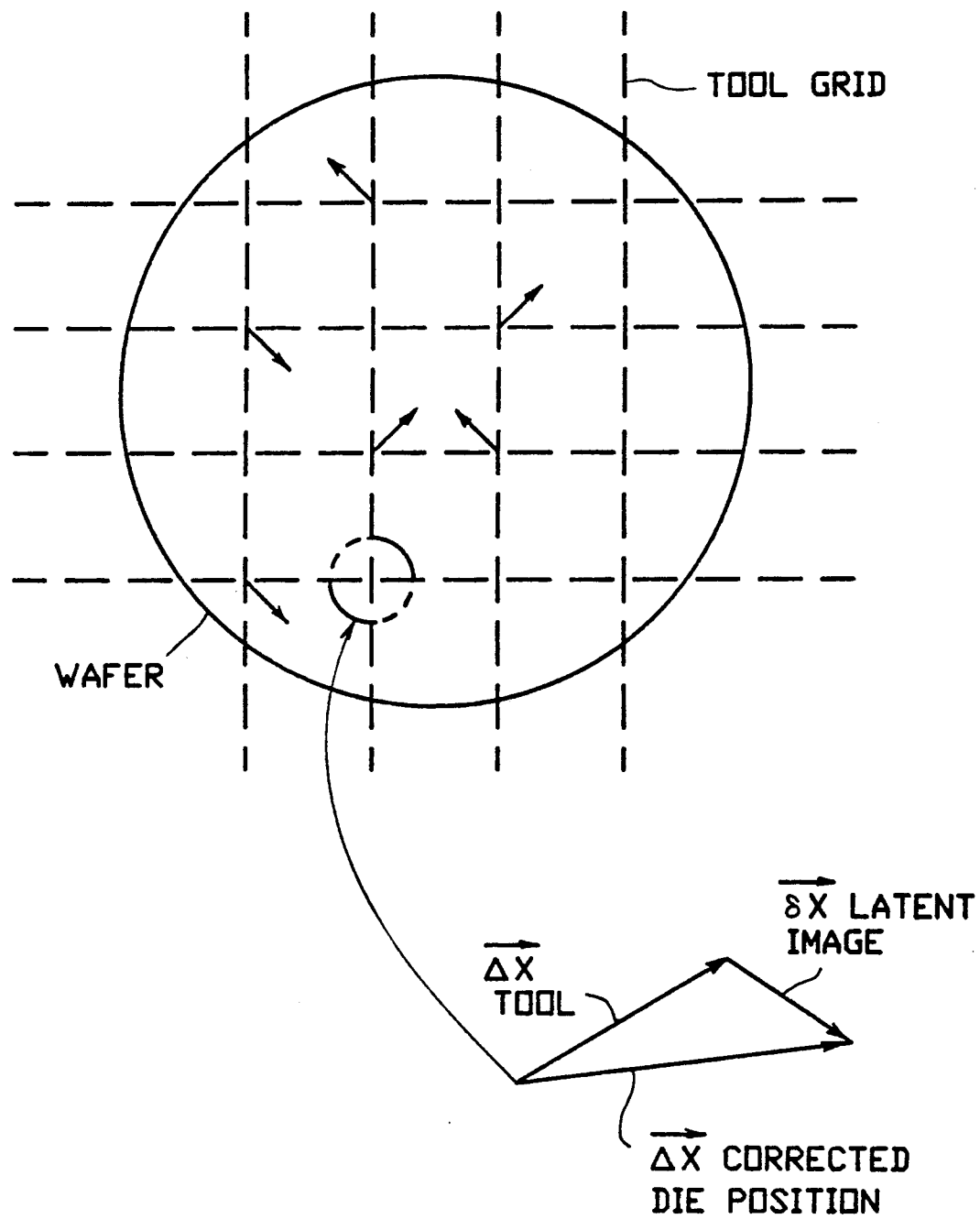
FIG. 12 is a graphical representation of tool grid and registration aid locations for blatant image enhanced global alignment.

FIG. 12 shows diagrammatically a superposition of a wafer upon a tool grid, such as the grid of the stepper of FIG. 3. Some small misalignment is found between various elements of the wafer and the tool grid. Arrows located at the intersection points of the grid indicate offset from the grid points from the corresponding parts of the wafer. One intersection point of the tool grid is enlarged and shown as the composite of three vectors indicating a correction which must be made to the tool grid to identify the location of the corresponding points of the wafer. This is a procedure in the latent image enhanced global alignment process. Each of the three vectors is an averaged value of tool offset, measured by conventional methods, and a further offset measured by the procedures of the invention based on latent image. The vectorial combination of these two vectors gives a vectorial representation of the corrected die position. These matters are disclosed in the ensuing mathematical description.

Figure 13:
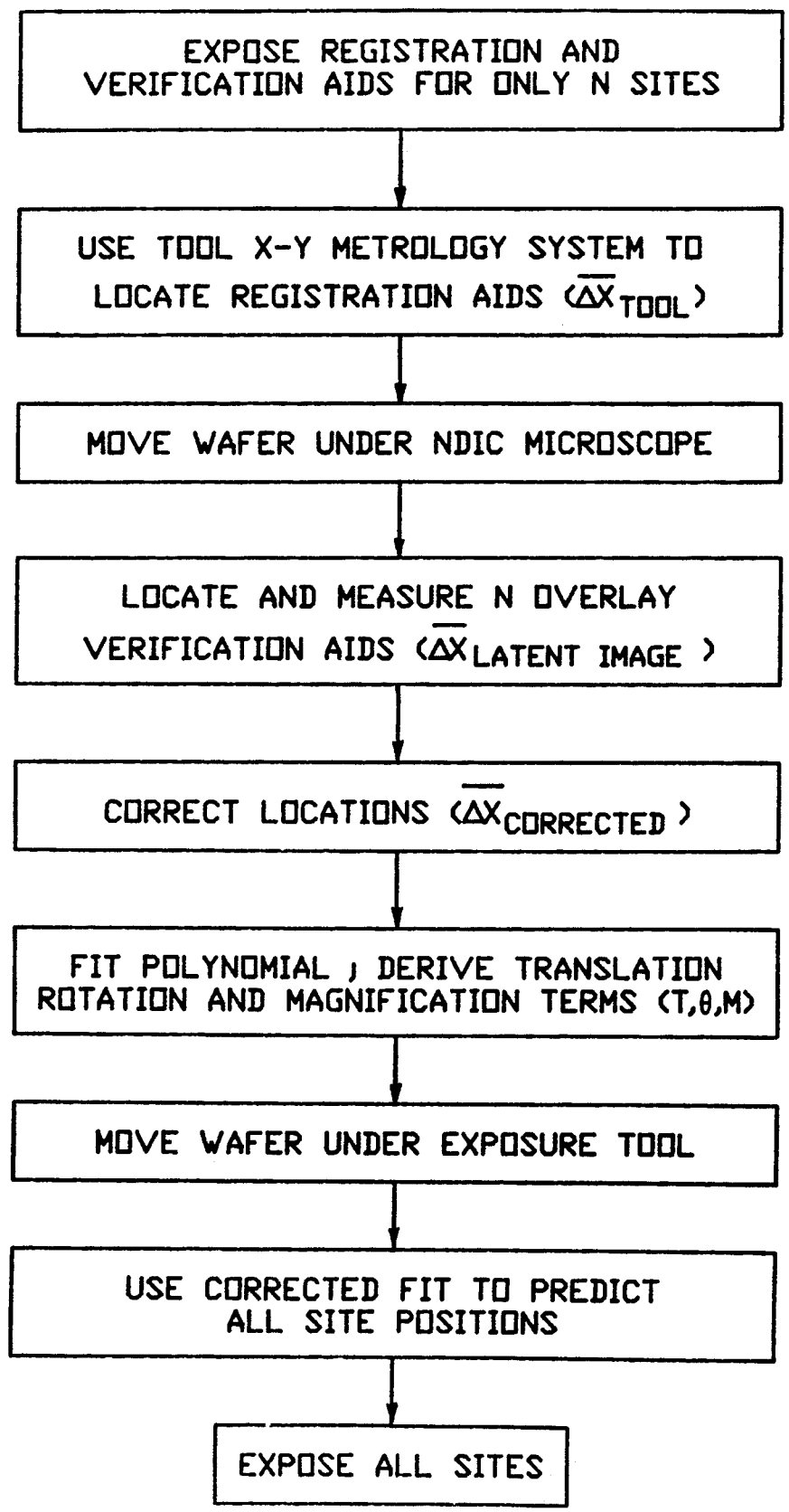
FIG. 13 is a flow diagram for latent image enhanced global alignment.

FIG. 13 shows the corresponding procedure for the latent image enhanced global alignment in accordance with a feature of the invention. The procedure begins with an exposing of the verification aids for a selected number; N, of sites. Then the lithographic tool X - Y metrology system is employed to locate the tool registration aids. Then the wafer is moved down to the microscope to provide for a locating and a measuring of the verification aids for the correspoinding N sites. By use of data obtained from the registration aids and the verification aids, the procedure continues with a correction of the locations of the sites. Then a polynomial is fit to the data, in accordance with mathematics to described hereinafter, this being accomplished by a derivation of translation, rotation and magnification terms employed in the mathematics. The translation relates to an offset in position in a specific direction, the rotation relates to a rotation of a guide relative to a correct attitude, and magnification relates to the projection optics 92 of FIG. 3 in which the physical size of the overlay projected onto the wafer may have a slightly different level of magnification than the corresponding region of the wafer. The procedure then continues with a moving of the wafer under the disclosure tool with use of the corrected fit to predict all site positions, this being followed by exposure of all sites by the ultraviolet radiation.

The foregoing procedures are implemented by use of longer wavelength radiation for measuring the latent image. However, if desired, and if a sensitive detector is available, it may be possible to use measuring radiation equal in frequency to the exposure radiation for viewing the latent image. In this case, the measuring radiation must have an intensity much less than that of the exposure radiation so as to minimize further exposure of the photoresist. Also, the use of the measurement radiation of the same frequency as the exposure radiation requires that the latent image of the verification marks still be usable even if somewhat damaged by the measurement radiation. However, the preferred embodiment of the invention presupposes the use of the lower frequency radiation for measurement of the latent image. Also, it is noted that in the preferred embodiment of the invention, the measurement procedures are accomplished in-situ as demonstrated by the apparatus of FIG. 3 in which the microscope is physically secured to the projection optics. However, the teachings of the invention can also be employed in ex-situ situation wherein the microscope is physically separate from the projection optics. The use of the microscope in the ex-situ situation assumes that there are adequate means such as tool registration marks, for aligning the wafer with the microscope and with the projection of the optics.

The concepts embodied in the foregoing procedures will now be explained in further detail by the following technical description including mathematical analysis.

1. New Measurement and Control Function

First it is useful to summarize the foregoing novel features of the invention. This is achieved by integrating a new measurement subsystem with any existing lithography tool. This allows elimination of any dependence on the X-Y state metrology system used to control substrate position, with the added flexibility of real-time, non-destructive die-by-die verification of exposure, focus and overlay. This new subsystem consists of a modified Nomarski microscope, an electronic image sensor, an electronic image processor, an autofocusing subsystem, and image and signal processing software.

2. New Measurement Technique for Exposure, Exposure Tool Focus and Line Width Based on an extension of the NDIC image ratio technique (Eastman, J. M. and Zavislan, J. M., "A New Optical Surface Microprofiling Instrument", SPIE Proceedings, V. 429, pp. 56–64, (1983)), a technique is presented to quantify exposure, focus and line-width characteristics of latent images. This is done using a Nomarski microscope modified with an electrooptic phase-shifter, and fitted with standard a full-field image sensor, thus allowing images to be acquired and analyzed at standard video rates.

3. New Overlay Measurement Algorithms

Utilizing special signal processing alogorithms, the effects of graininess, and substrate irregularities have been minimized. This allows differential measurement of currently used OL (overlay) verification targets for hitherto unmeasureable layers by any currently known technique. These algorithms are equally applicable to developed resist images as to LI (latent image) of differential overlay targets and, hence can be used a replacement algorithms on existing measurement tools.

4. Latent Image Enhanced Global Alignment (LIEGA)

A new methodology is presented that allows improved precision by eliminating the ETRO (exposure tool registration offset) introduced in alogorithms currently used to enhance the global alignment procedures. This is accomplished by using the differential nature of the OL algorithms described above, which are not dependent on the tool's wafer or reticle positioning precision.

5. Unique Application of Profiling to Closed-loop Control of Photoresist Post-expose Thermal Processing Certain photoresist systems sensitive in the DUV (ddp ultraviolet) are stabilized by heating for prescribed times and temperatures just following the exposure step. Heating can be done either globally on a wafer-by-wafer basis or with this new monitoring technique on a chip-by-chip basis. By real-time monitoring of the film-thickness change that occurs during the bake process, (using the above image ratio technique) end-point control of the thermal image development step can be achieved, thus allowing a determination of process completion, independent of prior pre-exposure processing, exposure dose, post-expose bake temperature, or bake time.

THEORETICAL CONSIDERATIONS OF INVENTION

Referring to FIG. 1, patterned product area and existing overlay verification patterns are used by this invention. Each successive level requires alignment to the previous lower level. The current level contains the LI in the top resist layer in the form of the outer box, while the previous level has an etched pattern from the previous series of processing steps. These patterns can be exchanged and reversed and the lower pattern can be raised lines instead of etched grooves. In addition, other geometrical (nested and non-nested) patterns can be used, such as L-in-an-L. The characteristics of the lower pattern can be altered by the requirements of the previous processing step. It can be coated with aluminum, polysilicon or other grainy substances, rendering accurate automated determination of the boundaries of the pattern very difficult.

Visualization of these LI patterns in accomplished by use of a Nuvacon (vidicon) camera and a modified Nomarski DIC (NDIC) microscope. This system is shown in FIG. 2 as a separate subsystem and in FIG. 3 integrated with an otherwise conventional step-and-repeat exposure tool. Other similar differential phase contrast methods will work similarly. While the preferred embodiment utilizes a full-field Nomarski microscope, less conventional Zernike or other phase contrast techniques will also suffice, since numerical differentiation can be performed on the captured image to produce the differential interference effect of Nomarski. By full-field is meant that the full field of view is illuminated more or less equally at one time and the imaging sensor detects the microscope image by scanning the miage in a raster scanned fashion, such as in the Nuvacon, or by detecting the image in parallel fashion using a CCD array. Other imaging schemes, requiring scanning of a laser beam and detection using a pair of diodes (Ref. 7) will also suffice. The image data is digitized on a two-dimensional grid in conventional fashion, where each data point is called a pixel. NDIC technique produces an image consisting of superposition of three components; two images, displaced in the shear direction defined by an adjustable Nomarski-modified Wollaston prism, and an interference contribution, whose amplitude is proportional to the phase difference between the two images as a result of a sample-induced OPL difference and the setting of the Wollaston prism. In order to gain a better understanding of this process, the following simplified mathematical relationship (Fairlie, M. J., Akkerman, J. G., and Timsit, R. S., "Surface Roughness Evaluation by Image Analysis in Nomarski DIC Microscopy", SPIE Proceedings, V. 749, pp. 105–113, (1987)) describes the various contributions to the image intensity, $I(x,y)$:

$$I(xy) = I_R(1 \pm \cos(\delta\phi(xy) + \beta)),$$

where $I(x,y)$, $\delta\phi,\beta$ denote two dimensional intensity dependence, phase shift due to OPL (optical path length) difference between spots and Wollaston adjustment, respectively. and $I_R$ denotes the common reflected intensity of the two spots. The assumption is that the amplitude factor in the reflectance changes little in traversing the LI feature, resulting in a constant $I_R$ for both orthogonally polarized images. This assumption is seen to be satisfied for the regions of practical substrates used for LI measurements.

UNIQUE APPLICATION—USE OF NDIC IMAGE RATIO TECHNIQUE TO MEASURE DIFFERENTIAL ENERGY DOSE, TOOL FOCUS AND LINEWIDTH USING LATENT IMAGES

Typically, the OPL difference detected for a LI is a combination of refractive index change and height difference between exposed and unexposed photoresist. This can be expressed mathematically as (see FIG. 4), $$OPL_u = 2n_u t_u,$$

wherein $OPL_u$ is the OPL change due to the unexposed resist, and $n_u t_u$ are the refractive index and thickness of the unexposed resist, respectively.

$$OPL_e = 2(n_e(t_u - \delta t) + \delta t),$$

wherein $OPL_e$ is the OPL change due to the exposed resist, and $n_e \delta t$ are the refractive index and thickness change of the exposed resist, respectively.

$$\delta\phi(E) = \frac{2\pi}{\lambda}(OPL_u - OPL_e),$$

where $\delta\phi(E)$ is the phase difference detected by the two Nomarski spots, one on the unexposed region, the other on the exposed, $\lambda$ is the measurement wavelength, and $E$ is the average actinic energy dose deposited in the resist.

$$\delta\phi(E) = \frac{4\pi}{\lambda}(n_u - n_e(E))t_u + (n_e(E) - 1)\delta t(E), \quad (2)$$

For the case that both the thickness and refractive index changes are a linear functions of energy, $$\delta t = \gamma_t t_u E.$$

wherein $\gamma_t$ is the fractional change in thickness due to exposure dose E and $$n_e = n_u - \alpha_n E,$$

wherein $\alpha_n$ is the linear coefficient defining the refractive index sensitivity to energy dose. Substituting into the above gives:

$$\delta\phi(E) = \left(\frac{4\pi}{\lambda}\right)\{\alpha_n + (n_u - )\gamma_t - \alpha_n\gamma_t E\}t_u E$$

This demonstrates the relationship, based on linear assumptions, between the phase difference between two Nomarski spots and the deposited energy dose, E, and constant thickness, $t_u$ fed forward from the apply and bake station preceding the exposure tool.

For small values of $\delta\phi$, for NDIC spot separations large compared to the LI transition distance, d, and Wollaston settings of $\beta = \pi/2$ the following relationship obtains(Ref 6):

$$I = I_R(1 \pm \delta\phi)$$

The foregoing is considered with (Fairlie, M. J., Akkerman, J. G., and Timsit, R. S., "Surface Roughness Evaluation by Image Analysis in Nomarski DIC Microscopy", SPIE Proceedings, V. 749, pp. 105-113, (1987)). Several techniques can be used to separate the reflected intensity contribution from delta phi. One of these techniques is heterodyned scanning laser microscope, which are capable of separating amplitude and phase response. This technique is more sensitive than needed for this application to Novalak resist systems, and is more complicated and expensive. In this embodiment, by adjusting the analyzer direction 45 degrees relative to the Wollaston shear direction, digitizing the image and readjusting to the 135 degree position and digitizing again, one has:

$$I_{45} = I_R(1 + \delta\phi),$$

and $$I_{135} = I_R(1 - \delta\phi).$$

By adding and subtracting these two images, one achieves the following: ps $$\delta\phi = I_{135} - I_{45}/I_{135} + I_{45}$$

$$I_R = I_{135} + I_{45}$$

Similar effects are seen for relative shifts of the polarizer relative to the Wollaston shear direction, i.e., leaving the analyzer setting constant, and adjusting the incoming polarizer. Several techniques can be used to shift the preferred directions of either the polarizer or analyzer. Electromechanical rotation devices, electrooptic rotators, liquid crystal devices all will suffice to provide computer control of the polarization for automation purposes. Calibration of the signal amplitude versus step height can accomplished by use of a aluminized step height standard such as available from VLSI Standards, attached to the stepper chuck.

The foregoing reference addressed the case where the Nomarski spot separation $\delta s$ is large compared to the transition distance, d, of the OPL change. Other useful relationships exists where ever $\delta s$ is comparable or smaller than d.

$$\delta\phi \simeq \frac{\partial\phi}{\partial x} \delta s.$$

Here, the Wollaston shear direction is x, which is also perpendicular to an edge or transition region of the latent image as in FIG. 4.

For Li edge transitions of d, the partial derivative can be approximated by $$\frac{\partial\phi}{\partial x} \simeq \frac{\frac{2\pi}{\lambda}(OPL_u - OPL_e)}{d}.$$

and the measurmed quantity, $$\delta\phi(d) \simeq \frac{\frac{2\pi}{\lambda}(OPL_u - OPL_e)}{d} \delta s.$$

Since exposure tool focus affects mostly the transition distance, d, and to a lesser extent the exposure dose change for large features, the height of the NDIC responce gives a relative measure of the focus performance for a constant exposure dose (see FIGS. 4,6).

In reality, the aggregate system response is the convolution of the Airy disks for each polarization, and the object edge features, thus the partial derivative approach is an approximation. Trial exposures at differing values of the focus servo set-point and subsequent in-situ measurement of the LI then allow real-time control of focus without removing the wafer from the chuck.

It's apparent from the above analysis and FIG. 4 that the positions of the peaks of the NDIC phase response to the LI can be used to form a metric of performance to allow control of the exposure tool. By interpolation of peak positions resulting from averaging and standard numerical routines, differences in position of the peaks in sub-pixel units can be used as a measure of LI line width, $\Delta\omega$, (see FIG. 4).

For energy dose monitoring, using Eq. 1, substrates with a photosensitive overcoat are positioned under the exposure tool's exposure column and a trial exposure is made. While the substrate is still constrained to the chucking device, the trial exposure field is moved out from under the exposure column and under the NDIC measurement microscope (see FIG. 5) The desired LI feature is located using image recognition software, measurement algorithms then process the captured image data using the above analysis. The information is then communicated to the tool to modify the exposure set-point, with the help of thickness $t_u$ data fed forward.

For the above case, relative phase independent of focus can be extracted by integrating the differential phase $\delta\phi$ giving:

$$\phi_{total} = \int_{x_0}^{x_{final}} d\phi,$$

$$\phi_{total}(E) = \frac{1}{\delta s} \int_{x_0}^{x_{final}} \frac{(I_{135} - I_{45})}{(I_{135} + I_{45})} dx$$

which is independent of focus or the sharpness of the transition of the LI from unexposed to exposed regions if the limits $x_0$ and $x_{fine}$ are in the unexposed and exposed regions of the latent image, respectively (see FIG. 4).

In summary, the above analysis shows that to first order, one can use NDIC to locate LI edges for the purpose of measuring OL verification targets, extract relative exposure information from LI for the purpose of controlling exposure dose, measure exposure tool focus performance by measuring edge acuity or sharpness of LI and, finally, measure LI feature dimensions directly by interpolating between pixel positions of peaks in the NDIC response.

UNIQUE FEATURE—OL MEASUREMENT ALGORITHM DESCRIPTION

Nested overlay verification structures, such as those described in FIG. 1, provide an intrinsic advantage in allowing a fully differential measurement of the centroids of the two structures the inner structure, at one level of a typical multi-layered product, and the outer structure, at the current level. This advantage is dependent upon the symmetry of the measurement microscope response to the edges of the structures. For NDIC, the response is inherently asymmetric, however the algorithm described here can deal with this asymmetry for the unnormalized NDIC images, or for the image ratio or normalized NDIC response. This same general purpose algorithm can, likewise, deal with images recorded using standard bright or dark-field microscopy.

The measurement algorithm performs an OL computation with demonstrated sub-pixel repeatability of 0.1 pixel at 3 sigma computing the locations of the primary target (usually the easily detected but noisy inner pattern under the photoresist), then the secondary target (usually the difficult to detect LI). Overlay is then the vector (two dimensional) difference between the locations. This value is then used as representative of the OL values for the entire patterned area near the OL verification mark (see FIG. 1).

Each stored image of the pattern pair, (primary and secondary) consists of a digitized array of data (pixels) corresponding to the x-y locations of microscope's response to the imaged substrate. Pixel spacing is calibrated using techniques known in the art. All computations are in units of pixel spacing. Precise pattern (target) position is computed by correlating a model of the pattern with the actual observed image using a unique method described below. Typically this type of computation would be performed using a heirarchical cross-correlation on the classical discrete form (Pennberth, M. J., and Rix, N. F., "Performance Modelling of Pattern Recognition Techniques for Calibration and Registration Mark Detection", Proceedings Microcircuit Engineering Conference, (1987)).

$$CC(x,y) = \frac{N \sum_{i,j} v_{i,j} m_{i,j} - \left(\sum_{i,j} v_{ij}\right) \times \left(\sum_{i,j} m_{i,j}\right)}{\sqrt{\left[N \sum_{i,j} v_{i,j}^2 - \left(\sum_{i,j} v_{ij}\right)^2\right]\left[N \sum_{i,j} m_{i,j}^2 - \left(\sum_{i,j} m_{i,j}\right)^2\right]}}$$

where $m_{ij}(x,y)$ is the model function centered on the wire frame edges, and $v_{ij}(xy)$ is the digitized pixel data, i and j are pixel indices in the x and y directions relative to a coordinate system common to both primary and secondary patterns, respectively, and N is the total number of pixels spanned by the calculation. This has the drawback that the calculation is computationally expensive and noisy in that much irrelevent information is included in the computation.

Essential to the uniqueness of this calculation is the partitioning of the above calculation. This differs from the literature (Pennberth, M. J., and Rix, N. F., "Performance Modelling of Pattern Recognition Techniques for Calibration and Registration Mark Detection", Proceedings Microcircuit Engineering Conference, (1987)).

A structured edge model is used to describe the pattern to be correlated in which only the relevant edges (elements) of patterns contribute to the position correlation between the model and the observed image. While a global, full pattern correlation is computed, areas interstitial to the edges are eliminated from the calculation by a spatial constraint of the correlation to the immediate neighborhood of the relevant pattern edges. This means that many forms of sample noise (variations in reflectivity or orange peel) and irrelevant features in removed from the edges of the OL verification patterns do not unduly influence the calculation. In addition to the above, edges are selected from the model during the correlation on the basis of their orientation relative to the axis being computed. That is, vertical edges are applied to the horizontal position calculation while horizontal edges are applied to the vertical position calculation. Thus only the most relevant image data is applied to the pattern position calculation.

Individual edge responses are combined to produce a response surface which is proportional to the intersection (common mode) of the constituent edge responses. Edge redundancy is thus exploited to diminish unwanted contributions and improve noise rejection.

By devising a penalty function that checks for the coincidence of a questionable response found in one of several redundant substructures against responses found in the remaining substructures, spurious contributors or detractors to the automated measurement of OL can be eliminated.

The final OL calculation must agree with the result of an independent targeting algorithm based on a pattern recognition technique.

The algorithm described above (and in more detail below) is primarily intended to refine a rough position estimate to an extremely precise on. As in all correlation methods, the final position estimate is based on a peak centroid calculation. Since the correlation surface will in general have multiple peaks, the algorithm will uniquely correlate to the pattern position providing the pattern position is known prior to a precision $+/-4$ pixels.

Simple pattern recognition based targeting is an advantage. While modern stage control systems allow positioning of the substrate to well within the field of view of the NDIC microscope, the ability to filter unwanted patterns of similar structure allows a fully automated measurement of OL for the purpose of real-time in-situ control. It is essential that operator intervention, such as that that might be required to move the OL verification pattern to within the capture range of the measurement algorithm, be eliminated in order to render the measurement process invisible to manufacturing floor personnel. We employ simple pattern recognition algorithms to locate the target to rough precision then require final agreement between the results of the two algorithms to within a few pixels to achieve both precision and confidence that the correct target has been selected.

Autofocusing techniques that make use of the image data allow full software control over the portion of the image used for z-positioning of the substrate.

Repeatable overlay measurements depend upon repeatedly locating the position of the plane of best focus. This algorithm employs a single focus measurement to effectively measure the pattern characteristics of both the top layer LI, and the lower primary target, several microns below. This avoids mechanical difficulties experienced in two focus techniques because of the lateral shift of the primary and secondary images at the two focus positions. Autofocus is carried out by incrementing the z position of the sample relative to the objective lens (or vice versa) until maximum signal power is achieved in the frequency band centered about the optical spatial resolution limit.

Referring to the box-in-box structure of FIG. 1, each box of the target structure is processed by the following steps:

Box-Edge Weighted Integration

The numerical integration is performed along each edge with the intent of smoothing local variations in edge position. The integrand is of the form of the convolution of the finite-impulse-response (FIR) of special design and slices of stored experimental data taken perpendicular to the edge direction. (See FIG. 8). Edge Correlation Sum" is the following:

Edge Correlation Sum

Vertical Edge at $i=i_E$ and $j=j_z \ldots j_R$ $$C_E(i) = \sum_{j=j_s}^{j=j_E} \sum_{m=-kw/2}^{m=+kw/2} H(m)PI(i-m,j)$$

where,
$i_E$ is the horizontal pixel coordinate of edge in image,
kw is the kernal or filter (FIR) width in pixel units,
$j_z$ is the vertical edge start position in pixel units,
$j_Z$ is the vertical edge end position in pixel units,
H(k) is the finite impulse response (FIR) filter function,
I(ij) is the digitized image data at pixel coordinates, i and j, and
P is the DIC edge polarity and is +1 for bright fringes and −1 for dark fringes.

Horizontal edge contributions are same as above but applied to horizontal edges.

The filter frequency response is tailored to the spatial frequency requirements for best OL accuracy achievable with the signal-to-noise available in the imaging system, i.e., the pass frequency excludes high frequency imaging detector noise, and low frequency fluctuations and drifts that result in peak-determination uncertainties. Aggregate Pattern-to-Wire Frame Cross Correlation The final pattern convolution is computed as the sum of all edge convolutions minus the sum of edge convolution deviations from the mean of edge convolutions. This is given as a "Model Correlation Sum", as follows:

Model Correlation Sum:

$$\overline{M} = \sum_{i=1}^{i=N} \frac{(C_E(i))}{N}$$

$$C_{Model} = \overline{M} - \sqrt{\left(\sum_{i=1}^{i=N} \frac{(\overline{M} - C_E(i))^2}{N}\right)}$$

where,
N is the number of edges contributing to the correlation sum,
$\overline{M}$ is the mean value of edge correlation sums, and,
$C_{Model}$ is the model correlation sum for all constituent edges.

These calculations are repeated for x and y incremented systematically, to find the peak position of the aggregate cross-correlation function as a function of a two-dimensional grid. The final x,y position is interpolated to sub-pixel accuracy by either fitting the functional dependence of the correlation function to a polynomial, or computing the centroid of the correlation peak using moments.

The resultant vector difference between primary and secondary patterns is a true differential measurement. It represents the difference between the position of the tool's registration aid, as referenced to its tool grid, and the actual position determined by printing the LI (see FIG. 12). The corrected position is given by:

$$x_{corr} = x_{tool} + \delta x_{LI}, \quad y_{corr} = y_{tool} + \delta y_{LI}. \qquad (4)(5)$$

While $\delta x_{LI}$ and $\delta y_{LI}$ are also subject to systematic offsets (dependent on level), these offsets can be minimized by 180 degree tests that can be performed ex-situ. In more detail the Pattern Position calculation is performed as follows:

Pattern Overlay Computation:

The pattern overlay computation involves computing the Pattern Fine Position for both inner and outer patterns separately and then subtracting the result to obtain the overlay offset.

Pattern Fine Position Computation:

The pattern position calculation involves performing a two pass correlation of the pattern (target) wire frame edge model against the observed image.

The correlation function for the pattern is computed in the horizontal and in the vertical direction +/−5 pixels about an assumed pattern position. Both vertical and horizontal pattern correlation functions are interpolated using the first moment method. The horizontal or vertical model correlation data is examined to find the peak, the moment calculation is then applied.

The estimated pattern position is updated to the position obtained from the interpolated correlation function.

This process is repeated a second time for better accuracy (note: a quadratic polynomial fit has also been used in lieu of the first moment method with good results).

Model Correlation Calculation:

The model correlation function is computed in either the horizontal or the vertical direction at a given time. In either case, the function combines the Edge Correlation (see below) for those wire frame model edges oriented perpendicular to the direction for which the correlation is being evaluated. The model edge correlation data are combined a each point by computing their sum and then penalizing the sum by subtracting the sum of deviations from the mean. In this way, the common mode signal is most favorably weighted so as to exclude perturbations in the individual edge responses due to sample noise, signal noise etc.

Edge Correlation Calculation:

The edge correlation function is computed by convolving a band pass FIR filter function perpendicular to the edge orientation at each point along the length of the edge and summing the results.

The bandpass filter is chosen to be centered about the optical maximum spatial frequency. It should be noted that all of the above generalizes to being able to precisely compute the position of a pattern consisting of one or more an arbitrary 2 dimensional curves (nested or otherwise).

UNIQUE APPLICATION—END-POINT CONTROL OF POST-EXPOSE THERMAL PHOTORESIST DEVELOPMENT

It is commonly observed that in some acid-catalyzed resist systems (Seligson, D., Siddhartha, D. and Pianetta, P., "Process Control with Chemical Amplification Resists Using Deep Ultraviolet and X-ray Radiation", J. Vac. Sci. Technol. V. B-6(6) pp. 2303-2307 (1988)), final CD control is highly sensitive to post-expose bake (PEB) time and temperature processing. The current processing sequence involves empirical determination of the interrelationships between PEB time and temperature processing, exposure dose, wet developer processing that follows PEB, and the final values of CD. It is not commonly recognized that a significant OPL change between exposed and unexposed regions occurs as a result of this thermal processing and that this change is a combined result of the latent image dependence on exposure dose, time, and temperature. Both refractive index and film thickness changes occur across the transition just as for an unbaked but exposed Novalac photoresist L1. For negative resists, this change is the result of the increase in the cross linked polymer density, $N_{CL}$, (in the exposed area of a negative resist, say) relative to the uncrosslinked polymer density, $N_{CL}$ for positive resists, the step height change is due to the surface percolation of by-products of the photo-induced acid production. For the case that the OPL is predominantly due to the film thickness change, the phase change due to the increased $N_{cl}$ $$\delta\phi(E,T,t) = \left(\frac{4\pi}{\pi}\right)(n_u - 1)\delta h(E,T,t),$$

where $\delta h(E,T,t)$ is the physical step between unexposed and exposed regions and is directly related to the reduction in volume caused by the increase in cross linking. By use of the normalized NDIC response, a direct measurement of $\delta h$ can be used for the purpose of end-point detect and control by comparing the time evolution of $\delta\phi$ for variable values of E and T, and comparing with an experimentally determined set point in real-time: (see FIG. 10)

$$\Delta_{error}(t) = \delta h_{sp} - \delta h(E,T,t).$$

For fixed developer times, $h_{sp}$ (the set-point height) fixed, thus allowing a direct measurement and control over processing variables E, T and t. This technique allows automatic compensation for changes in E, T and t, thus achieving minimum CD variation. This is consistent with the notion of Ref. 10 of an effective dose, $D_{eff}$, which is a balance between the three variables.

In addition to the above end-point control, direct measurement of CD can be accomplished, also as a function of E, T, and t, thus adding another direct confirming measurement to that determined by an empirically determined end-point, $\delta h_{sp}$

UNIQUE APPLICATION—LATENT IMAGE ENHANCED
GLOBAL ALIGNMENT (LIEGA)

Adaptive adjustment of the exposure tool's metrology system can be accomplished in order to compensate for distortions in prior layers. These distortions can be caused by prior thermal processing, base-line differences between exposure tools in a mix-and-match environment, base-line drifts in the existing tool, reticle image placement differences and other contributors. One way of mitigating this distortion is to use the exposure tool in a self-calibration mode in which the local registration aid positions of some limited number of sites are compared to the tool grid (TG) provided by the laser interferometry system controlling the stage. This is accomplished using the tool in the local registration mode, as opposed to the global mode (see FIG. 1). One step-and-repeat (stepper) company, GCA, accomplishes in a two pass fashion, the first pass with the blades controlling the region of exposure adjusted to only illuminate the peripheral registration aid marks, thus recording the readings provided relative to the TG. This information is used in a six parameter fitting algorithm, such as that published by Perloff (Perloff, D. S., "A Four-Point Electrical Measurement Technique for Characterizing Mask Superposition Errors on Semiconductor Wafers", IEEE Journal of Solid-State Circuits, V. SC-13, No. 4, pp. 436-464 (1978)). In second pass, these parameters are used to interpolate the positions of the fields (with the blades now fully extended to expose the entire field).

Sparse sampling of the positions of the registration marks across the wafer and the subsequent fitting of those positions to a polynomial series is commonly done in practice today. The standard form is as follows:

$$O_x(xy) = T_x \Theta_x y + M_x x$$

are translation, rotation and magnification, respectively. A similar equation holds for y. By fitting these equations in the least-squares sense, these parameters can be expressed in a form that involves summations over the x and y positions of the registration aids relative to the TG. Using the procedure depicted graphically in FIG. 13, a correction to these positions can be made using the measurements of the OL described earlier. Since the OL verification aid (as distinct from the registration aid (see FIG. 1)) provides a relative measurement, not involving the translation errors introduced by the stage metrology system, some portion of the tool's systematic offset (ETRO) can be compensated. In addition, the technique of this invention allows a direct measure of relative image placement, thus avoiding other tool contributors to error. This relative, LI-based OL measurement can be used to adjust the results of the tool's determination of the registration aid position. For example, the incremental adjustments provided by the LI OL measurement result in a new estimate of the parameter, $T$ sub $x$ given by:

$$T_x = O_x + \Theta_x y + M_x x.$$

where $$O_x = \frac{1}{N} \Sigma O_{xj,x} = \frac{1}{N} \Sigma x_j, y = \frac{1}{N} \Sigma y_j.$$

The definition of $x_j$, $y_j$ is given by:

$$x_j = x_j(\text{Tool}) + \delta x_j(LI).$$

and $$y_j = y_j(\text{Tool}) + \delta y_j(LI).$$

where, $x_j(\text{Tool})$ is the x coordinate of the jth registration aid relative to TG, and $\delta x_j(LI)$ is the incremental correction resulting from the differential LI OL measurement. Similar definitions hold for the y-coordinates.

Similar results hold for the other five parameters and modifications of the formulae (5) through (12) given in Ref. 9 are straight forward and obvious. It's also possible to expand this data in other orthogonal series with the correct symmetry—an approach obvious to anyone familiar with the art.

Note that this represents a significant improvement to the procedures outlined in the IBM TDB articles of (Chappelow, R. E., Higgins, J. J., Mitchel, P. M., "Multipoint Alignment: Methods for Providing Improved Overlay Yield", IBM TDB, V. 26, pp. 5896–97 (April, 1984)

Chappelow, R. E., "Overlay Characterization Technique For Exposing Integrated Circuit Wafers", IBM TDB, V. 28, p. 4302 (March, 1986)

APPLICATIONS

Step and Repeat Optical Exposure Tools

This invention may be applied to a variety of exposure tools currently on the market, including GCA, Canon, Nikon, Ultratech, ASM, Censor, Perkin Elmer PE-200, PE-500, and PE's Step-and-Scan. E-beam Exposure Tools This invention may be applied to a variety of electron beam exposure tools, including Perkin Elmer Mebes and IBM's Hontas. The technique can be extended to detect and measure field stitching errors before the wafers (semiconductor mfg.), or reticles (mask mfg.) are processed.

Magnetic Head Manufacturing

Magnetic head manufacturing requires a lithography step that results in a non-reversible subsequent etch step before the quality of the lithography process is determined. The use of latent image measurement techniques would prevent considerable scrap.

General Applicability of Overlay Measurement Algorithms

The algorithms described herein can be ported onto any overlay metrology tool, including Vickers Quaestor, Leitz-Heidlberg Scanning Confocal Microscope, and SiScan Scanning Confocal Microscope.

Extendibility to DUV Resists

The algorithms and techniques described in the current invention can be applied to existing and future deep ultra-violet (DUV) resist systems and those resists designed to be sensitive to soft x-ray radiation, such as that produced by the Hampshire Instruments, Inc. laser-plasma step and repeat system and synchrotron-based step-and-repeat systems.

ADVANTAGES

In-situ Measurement of Chucked Wafer

Silicon or gallium-arsenide wafers are typically thin enough to flex when attached to the vacuum chucks used to restrain the wafer in the exposure tool. This leads to distortions and displacements of the final image from the ideal. In addition, the effects of prealignment of the wafer, and final rotational alignment of either the reticle or wafer is typically done once at the beginning of the exposure process. By measuring the effects of these actions at the beginning of chip-by-chip expose sequence, fine corrections of the tool's control setpoints can be effected, resulting in improved OL performance.

Direct Independent Measurement of Photoresist Response

Many factors affect the actinic dose directly responsible for photo-chemical changes within the resist. Standing wave patterns are but one mechanism responsible for systematic variations in the final deposited optical energy within the resist layer. Variations in the aerial or projected image are another. By measuring the response of the resist layer through changes in absorption, refractive index or thickness changes, the response of the resist can be determined immediately and the information gained used to control the tool in real-time.

Non-actinic Wavelength Measurement is Non-destructive

By adjusting the measurement wavelength to lie above the actinic band of the photoresist, non-destructive measurements can be conducted to allow actual product structures to be measured for patterned areas in a step-and-repeat exposure tool and the information used to correct for subsequent field exposures or for reprocessing of previous fields. This avoids the use of special patterns in the kerf of product substrates, which may not be representative of actual patterned areas.

Overlay, Exposure, Focus and Reflectivity Information can be Gained in A Few Video Frame Times.

In the preferred embodiment, either a CCD or Nuvacon camera gathers information in frames, with 512X512 pixels per frame of digitized image data gathered in one thirtieth of a second. Kerf-area test patterns can provide all of the above information.

Offset Corrections can be Applied in Real-time

Since measurement of box-in-box overlay verification structures is full-field, the measurement is differential, i.e., centroid calculations are made on relative positions of edges of the LI of the outer box, while similar calculations based on relative positions of the inner etched box are also made. There are no x-y stage contributions to the measurement uncertainty. Since there is also no dechucking or developer processing—chucking distortions and developer biases are automatically eliminated or accounted for in the measurement results.

In-situ Measurement Capability Eliminates Need for External Measurement Tool Floor space and personnel reductions and mean lower production costs and higher yield due to reduced handling-related contamination. In addition, in-situ strategy allows transparent integration and automation of additional controls reducing need for operator intervention.

Extendibility

By use of more sensitive detection systems, such as heterodyned laser scanning systems using interferometric methods, resist images not detectable by conventional methods can be used to control currently developing lithography processing steps. These techniques have been used to see latent Images in deep ultraviolet (DUV) resist systems as well as, multilayer and surface-imaging resist systems.

Separation of Exposure and Post-exposure Processing

Processing that takes place after exposure complicates the isolation of the causes of out-of-spec processing. Exposure tools can be made to run within specified bounds or windows, independent of follow-on parametric changes.

It is to be understood that the above described embodiments cf the invention are illustrative only, and that modifications thereof may occur to those skilled in the art. Accordingly, this invention is not to be regarded as limited to the embodiments disclosed herein, but is to be limited only as defined by the appended claims.

What is claimed is:

1. A method of controlling a lithographic tool operating on a surface of a workpiece, the method comprising steps of:
   observing the surface of said workpiece; and
   wherein said observing comprises:
   viewing adjacent sites at a first location on said surface with separate beams of radiation to obtain data of said surface by differential phase shift induced on said beams by reflection from said surface; and
   converting said differential phase shift to amplitude data to produce an image point of said first location;
   said method further comprising steps of
   repeating said observing step at additional locations spaced from said first location to obtain further image points, all of said image points constituting detected image of points on said surface;
   providing a reference image pattern; and
   correlating detected image with said reference image by use of an edge correlation sum.

2. A method of controlling a lithographic tool having an exposure head and a microscope for processing a wafer having a plurality of fields containing product areas, said wafer being covered with a layer of photoresist, the method providing for a correction of exposure dosage of the photoresist, the method comprising steps of:
   exposing a number of said fields, said exposing producing a latent image in said photoresist for each of said number of fields;
   moving said wafer to a microscope operative to obtain image data of said photoresist by differential phase shift;
   measuring amplitude obtained from the differential phase shift across latent images for each of said number of fields, said step of exposing producing a change of thickness in said photoresist;
   obtaining previously measured photoresist thickness data for all of said fields;
   calculating exposure correction;
   moving the wafer back to the exposure head; and
   exposing said photoresist with a further dosage of radiation to adjust the thickness of the photoresist.

3. a method of controlling a lithographic tool having a microscope and an exposure head for processing a wafer, the wafer having a coating of photoresist and comprising a plurality of fields each of which includes a product area, the method providing for a correction of focus of the exposure head, the method comprising steps of:
   exposing a number of the fields with stepped focus;
   moving said wafer to said microscope, said microscope being operative to produce a detected image of a latent image by differential phase shift;
   measuring points of the detected image across the latent image for each cf said number of fields;
   calculating a best focus position;
   returning the wafer to said exposure head;
   adjusting said focus; and
   exposing the photoresist by said exposure head with a new value of focus.

4. A method of controlling a lithographic tool having a microscope and an exposure head for processing a wafer, the wafer having a coating of photoresist and comprising a plurality of fields each of which includes a product area, the method providing for a measuring of line width in a latent image in said photoresist, the latent image in the photoresist being produced by exposure of the photoresist, the method comprising the steps of:
   exposing a number of said fields with step exposure and focus, the exposure producing a latent image in the photoresist;
   moving the wafer to said microscope;
   measuring a distance between each position of image points lying on each side of a line in said latent image to obtain a measure of the line width;
   calculating a best focus and an exposure combination by comparison of the line width with a line-width set point;
   returning the wafer to said exposure head;
   setting a new focus and amounts of exposure at said exposure head; and
   exposing the photoresist with a new combination of focus and quantity of exposure.

5. A method of controlling a lithographic tool having a microscope and an exposure head for processing a wafer, the wafer having a coating of photoresist and comprising a plurality of fields each of which includes a product area, exposure of the photoresist via a reticle in said exposure head producing a latent image with verification marks in the photoresist, the method providing for an alignment of the wafer with the exposure head, the me&:hod comprising steps of:
   exposing a number of said fields, one field at a time;
   moving the wafer to said microscope, said microscope being operative to produce the detected image of the latent image by differential phase shift;
   locating an overlay verification aid;
   measuring average overlay values of offset in each of two dimensions for each of said number of fields;
   correcting coordinates of said tool for a field position;

returning the wafer to said exposure head; and
exposing said photoresist with new overlay values.

6. A method of evaluating a bake cycle by use of a lithographic tool having a microscope and an exposure head for processing a wafer, the wafer having a coating of photoresist and being subjected to a bake cycle, exposure of the photoresist via a reticle in said exposure head producing a latent image with verification marks in the photoresist, said microscope being operative to produce a detected image of the latent image by differential phase shift, the method comprising:
   prebaking the wafer;
   exposing the entire wafer by said exposure head;
   moving said wafer to a bake station;
   placing said wafer on a heated vacuum chuck;
   employing said microscope to measure the amplitude of points of said detected image;
   evaluating dimensions of said verification marks in an overlay;
   determining whether the amplitude of points of the detected image is sufficient to indicate adequate baking;
   quenching the wafer by moving the wafer to a cooled platen; and
   developing the photoresist.

7. A method of employing a lithographic tool to obtain latent image enhanced global alignment by use of verification marks and tool registration marks, the tool having a microscope and an exposure head for processing a wafer, the wafer having verification marks thereon and being coated with photoresist, exposure of the photoresist by a reticle in said exposure head producing a latent image with verification marks in the photoresist, said microscope being operative to produce a detected image of a latent image in the photoresist by differential phase shift, the method comprising steps of:
   exposing registration and verification marks at a number of sites on the wafer;
   employing the lithographic tool to locate the registration marks;
   moving the wafer under said microscope;
   locating and measuring overlay verification marks for each of said number of sites;
   correcting locations of said registration marks by fitting a polynomial, the deriving translation, rotation, and magnification terms of the polynomial to determine corrective positioning of the entire wafer;
   moving the wafer under said exposure tool;
   using corrected fit to predict all site positions; and
   exposing all sites of the wafer.

8. A method of controlling a lithographic tool having a microscope and an exposure head for processing a wafer, the wafer having a coating photoresist and comprising a plurality of dies, there being primary verification marks and tool registration marks located on the surface of said wafer, the method comprising steps of:
   exposing said photoresist via a reticle in said exposure head to produce a latent image with secondary verification marks in the coating of photoresist;
   observing a surface of said coating by use of said microscope, said microscope being operative to produce a detected image of the latent image by differential phase shift;
   observing a surface of said coating by use of said microscope, said step of observing including a viewing of adjacent sites at a first location on said coating surface with separate beams of radiation to obtain data of said coating surface by differential phase shift induced on said beams by reflection from said coating surface, said step of observing also including a converting of said differential phase shift to amplitude data to produce an image point of said first location in said detected image;
   repeating said observing step at additional locations on said coating surface spaced from said first location to obtain further image points in said detected image, all of said image points constituting said detected image;
   wherein said observing step further comprises a step of illuminating said coating with radiation to which said coating is transparent to provide reflections from said coating surface and from an interface between said coating and said wafer, the reflections providing images of said primary and said secondary verification marks in said detected image; and
   wherein said method further comprises:
   correlating said detected image with reference images of verification marks to obtain a centroid of each of said verification marks; and
   measuring the distance between the centroids to determine alignment of the wafer.

* * * * *